(12) United States Patent
Balakrishnan et al.

(10) Patent No.: US 10,566,447 B2
(45) Date of Patent: Feb. 18, 2020

(54) SINGLE COLUMN COMPOUND SEMICONDUCTOR BIPOLAR JUNCTION TRANSISTOR WITH ALL-AROUND BASE

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 15/818,438

(22) Filed: Nov. 20, 2017

(65) Prior Publication Data

US 2019/0157434 A1 May 23, 2019

(51) Int. Cl.
*H01L 29/737* (2006.01)
*H01L 29/08* (2006.01)
(Continued)

(52) U.S. Cl.
CPC ...... *H01L 29/7371* (2013.01); *H01L 21/0217* (2013.01); *H01L 21/02532* (2013.01); *H01L 21/02595* (2013.01); *H01L 29/0649* (2013.01); *H01L 29/0817* (2013.01); *H01L 29/0821* (2013.01); *H01L 29/1004* (2013.01); *H01L 29/267* (2013.01); *H01L 29/32* (2013.01); *H01L 29/41708* (2013.01); *H01L 29/42304* (2013.01); *H01L 29/66318* (2013.01); *H01L 21/02381* (2013.01); *H01L 21/02461* (2013.01); *H01L 21/02546* (2013.01)

(58) Field of Classification Search
CPC ..... H01L 29/0804–0826; H01L 29/732–7327; H01L 29/7371–7378; H01L 29/73; H01L 21/8222; H01L 27/0664; H01L 29/0649; H01L 29/0817; H01L 29/0821; H01L 21/0217
See application file for complete search history.

(56) References Cited

U.S. PATENT DOCUMENTS

| | | | | |
|---|---|---|---|---|
| 4,764,801 A | * | 8/1988 | McLaughlin | ..... H01L 21/28531 257/518 |
| 5,977,572 A | * | 11/1999 | Liu | ..................... H01L 29/7371 257/197 |

(Continued)

FOREIGN PATENT DOCUMENTS

| | | |
|---|---|---|
| CN | 106170868 A | 11/2016 |
| JP | 08186123 A | 7/1996 |

(Continued)

*Primary Examiner* — Eric A. Ward
*Assistant Examiner* — Eric K Ashbahian
(74) *Attorney, Agent, or Firm* — L. Jeffrey Kelly, Esq.; Hoffmann & Baron, LLP

(57) ABSTRACT

A vertical, single column compound semiconductor bipolar junction transistor device includes an all-around extrinsic base. Aspect ratio trapping is employed during fabrication of the transistor device on a silicon substrate. Homojunction and heterojunction devices are formed using III-V materials with appropriate bandgaps. The emitter of the device may be electrically connected by a lateral buried metal contact.

11 Claims, 21 Drawing Sheets

(51) Int. Cl.

| | |
|---|---|
| *H01L 29/10* | (2006.01) |
| *H01L 29/417* | (2006.01) |
| *H01L 29/423* | (2006.01) |
| *H01L 29/267* | (2006.01) |
| *H01L 29/32* | (2006.01) |
| *H01L 29/66* | (2006.01) |
| *H01L 21/02* | (2006.01) |
| *H01L 29/06* | (2006.01) |

(56) References Cited

U.S. PATENT DOCUMENTS

| | | | |
|---|---|---|---|
| 9,391,181 B2 | 7/2016 | Chu-Kung et al. | |
| 2009/0179303 A1* | 7/2009 | Heinemann | H01L 29/1004 257/586 |
| 2011/0057266 A1* | 3/2011 | Wallner | H01L 21/8249 257/378 |
| 2013/0056855 A1* | 3/2013 | Donkers | H01L 21/8249 257/592 |
| 2014/0175509 A1 | 6/2014 | Chu-Kung et al. | |
| 2015/0263095 A1* | 9/2015 | Chan | H01L 29/155 257/17 |
| 2015/0357446 A1* | 12/2015 | Tschumakow | H01L 29/66242 257/586 |
| 2016/0322228 A1 | 11/2016 | Mochizuki et al. | |
| 2016/0322392 A1 | 11/2016 | Mochizuki et al. | |
| 2017/0012125 A1 | 1/2017 | Le et al. | |
| 2017/0018606 A1 | 1/2017 | Chan et al. | |

FOREIGN PATENT DOCUMENTS

| | | |
|---|---|---|
| KR | 1020160137970 A | 12/2016 |
| WO | 2012175716 A1 | 12/2012 |

* cited by examiner

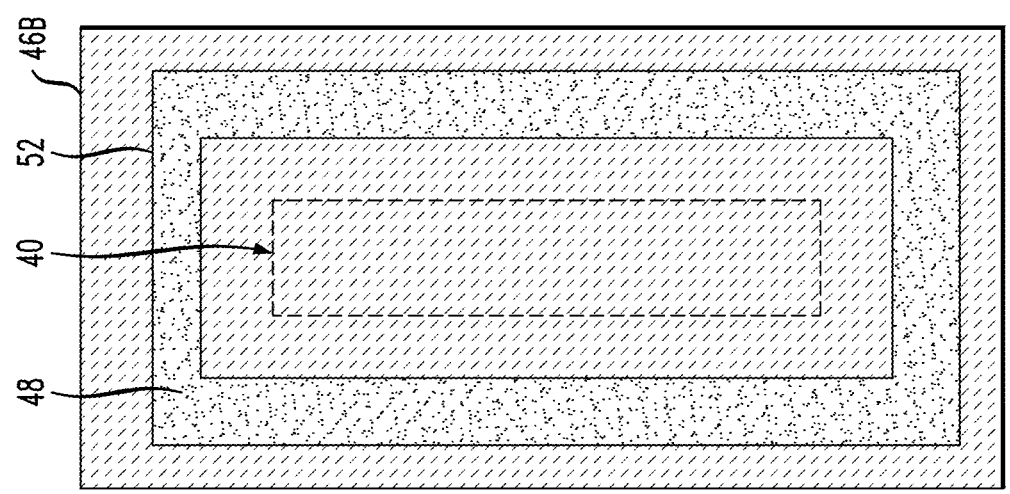
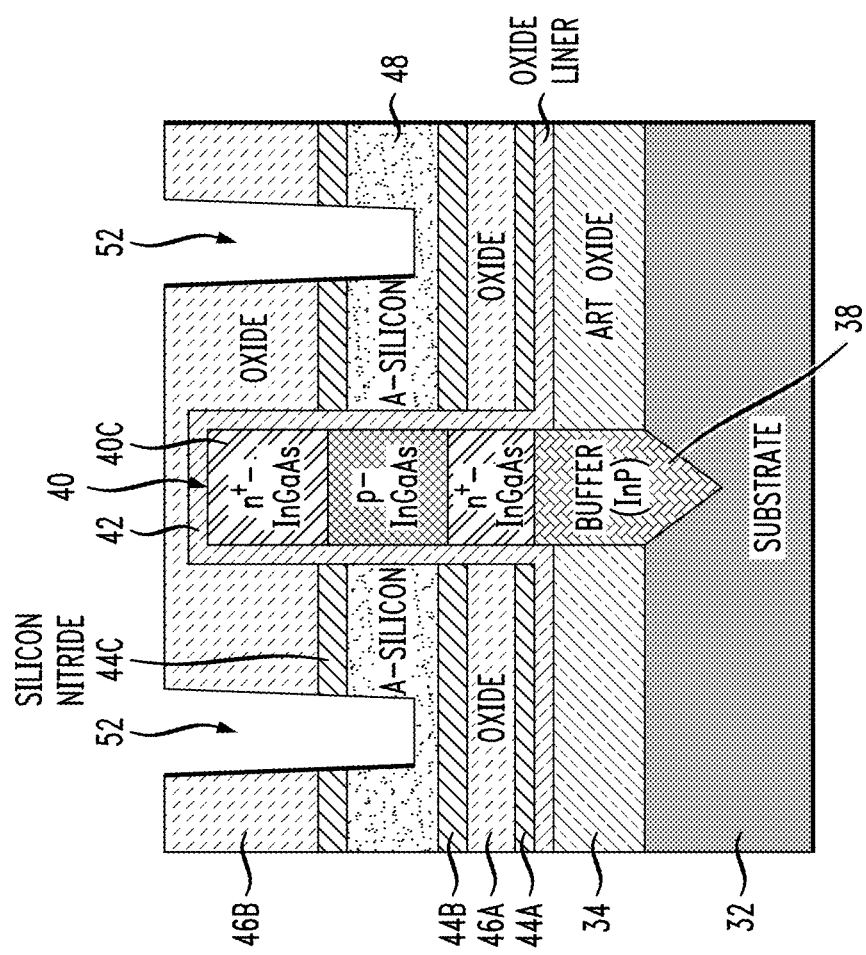
FIG. 10B
FIG. 10A

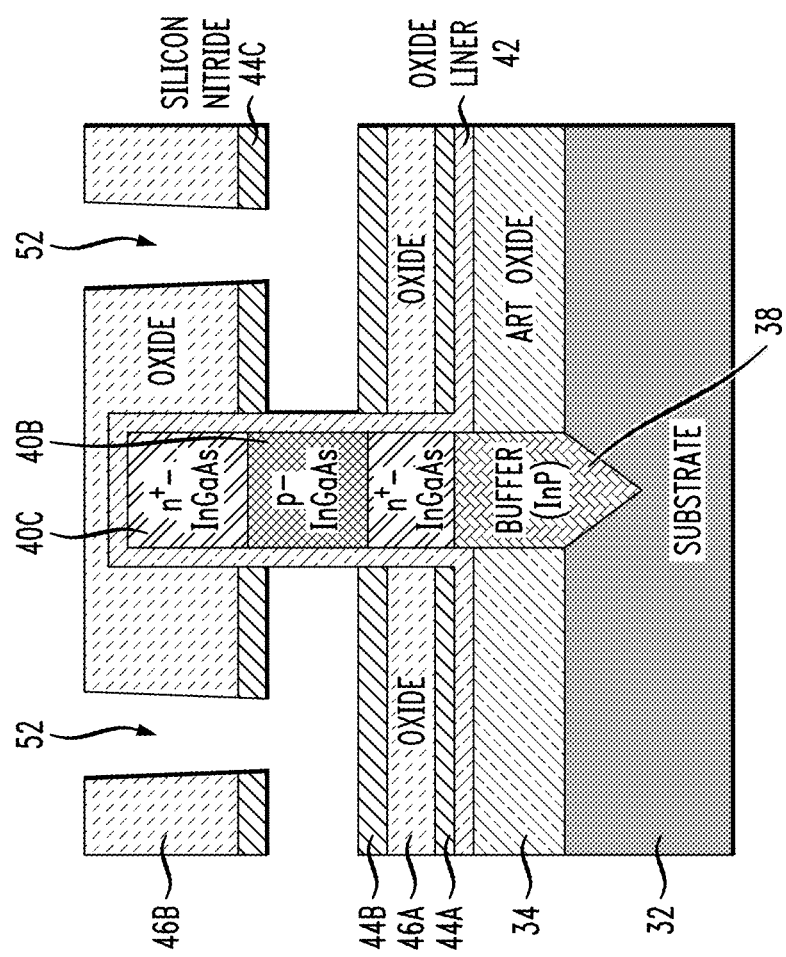
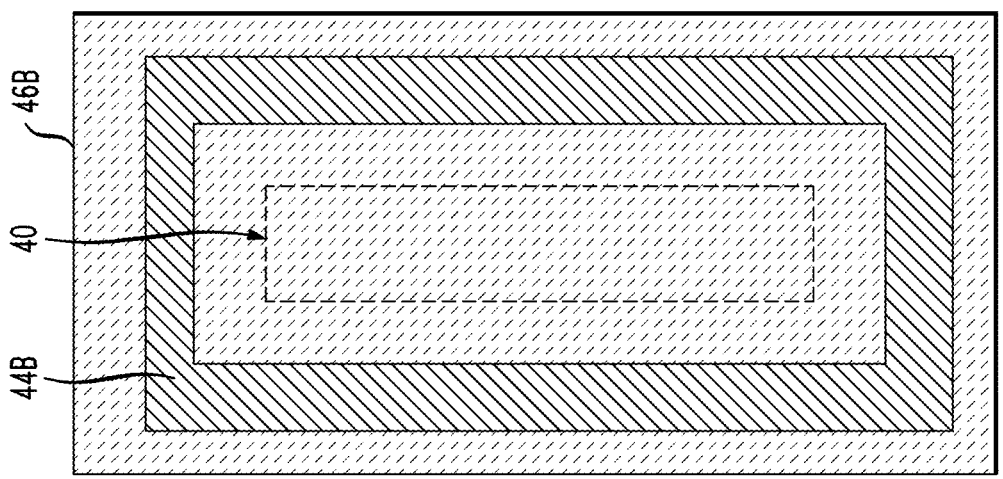

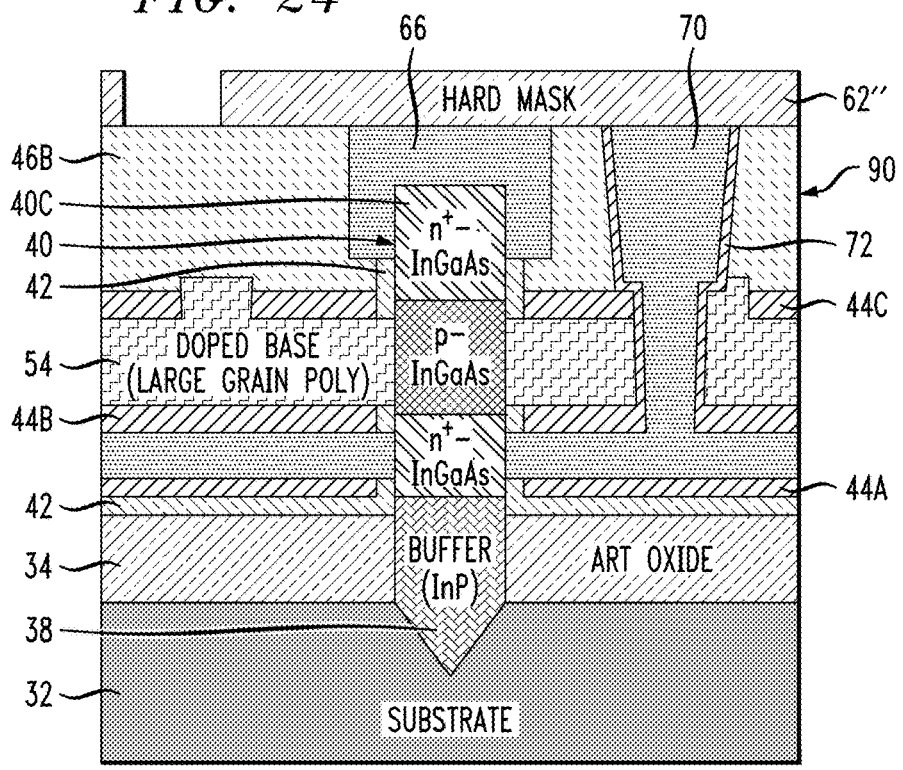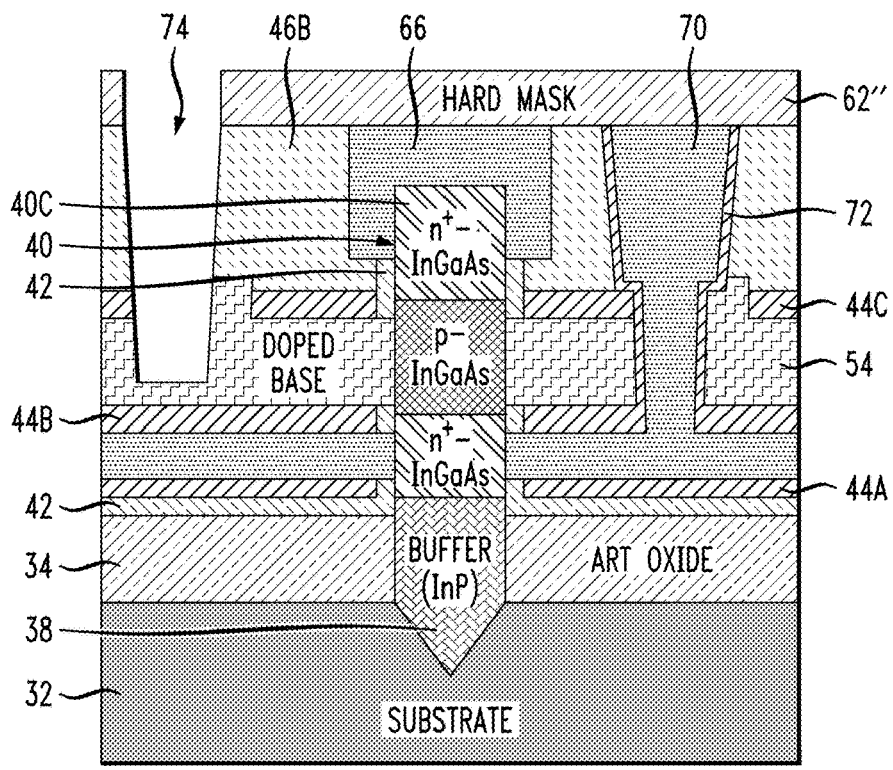

SINGLE COLUMN COMPOUND SEMICONDUCTOR BIPOLAR JUNCTION TRANSISTOR WITH ALL-AROUND BASE

BACKGROUND

The present disclosure relates generally to the electronic arts and, more particularly, to bipolar junction transistors and their fabrication.

Bipolar junction transistors include emitter, collector and base regions. A biasing voltage applied between a base contact and an emitter contact allows control of collector current. Bipolar junction transistors can be employed as sensors, switches, amplifiers, and for high performance and/or high voltage applications. A heterojunction bipolar transistor, which is a type of bipolar junction transistor, includes a bandgap difference between the emitter and base.

Bipolar junction transistors using compound semiconductors are suitable for high performance applications when small-bandgap semiconductor materials are used and for high voltage applications when large bandgap semiconductor materials are used.

BRIEF SUMMARY

Bipolar junction transistor structures and techniques for fabricating such structures are disclosed.

In one aspect, an exemplary single column bipolar junction transistor device includes a semiconductor substrate, a dielectric layer on the semiconductor substrate, a trench extending through the dielectric layer, and a vertical column of compound semiconductor material extending from the semiconductor substrate. The vertical column includes a heavily doped III-V compound semiconductor collector having a first conductivity type, a heavily doped III-V compound semiconductor emitter having the first conductivity type, and a doped III-V compound semiconductor sublayer having a second conductivity type opposite to the first conductivity type. The doped III-V compound semiconductor sublayer is between and directly contacts the collector and the emitter. Aa III-V compound semiconductor buffer layer extends through the trench in the dielectric layer and directly contacts the vertical column and the semiconductor substrate. A doped extrinsic base completely surrounds and directly contacts the doped III-V compound semiconductor sublayer. A collector contact is electrically connected to the collector, an emitter contact electrically is connected to the emitter, and a base contact is electrically connected to the extrinsic base.

In another aspect, an exemplary method of fabricating a structure including single column bipolar junction transistor device includes obtaining a structure including a semiconductor substrate, a dielectric layer on the substrate, and a vertically extending trench extending through the dielectric layer, the vertically extending trench being configured for aspect ratio trapping. A vertical column of III-V compound semiconductor material is formed within the vertically extending trench by epitaxially growing a III-V compound semiconductor buffer layer on the substrate, epitaxially growing a heavily doped III-V compound semiconductor bottom sublayer having a first conductivity type on the buffer layer, epitaxially growing a doped III-V compound semiconductor middle sublayer having a second conductivity type opposite to the first conductivity type on the bottom sublayer; and epitaxially growing a heavily doped III-V compound semiconductor top sublayer having the first conductivity type on the middle sublayer. The dielectric layer is recessed to expose at least the top, middle and bottom sublayers of the vertical column. A plurality of sacrificial layers are formed over the recessed dielectric layer, the plurality of sacrificial layers including a bottom sacrificial layer around the bottom sublayer, a middle sacrificial layer around the middle sublayer and a top sacrificial layer around the top sublayer. The middle sacrificial layer is removed to form a space between the bottom and top sacrificial layers. A doped extrinsic base is epitaxially grown on the middle sublayer and within the space between the bottom and top sacrificial layers, the extrinsic base extending entirely around the middle sublayer.

Techniques and devices as disclosed herein can provide substantial beneficial technical effects. By way of example only and without limitation, one or more embodiments may provide one or more of the following advantages:

Relatively small base-collector capacitance;
Emitter/collector can be symmetrical if desired;
Fabrication on silicon substrates facilitated.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 10A and 10B are schematic, cross-sectional and top plan views, respectively, following formation of an all-around trench in the structure shown in FIG. 9;

FIGS. 11A and 11B are schematic, cross-sectional and top plan views, respectively, following removal of one of the sacrificial layers from the structure shown in FIGS. 10A and 10B;

FIGS. 15A-B-FIG. 25 are views depicting exemplary steps/stages showing base, emitter and collector contact formation using the structure shown in FIG. 14.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative vertical single column compound semiconductor bipolar junction transistors fabricated on a silicon substrate. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1B:
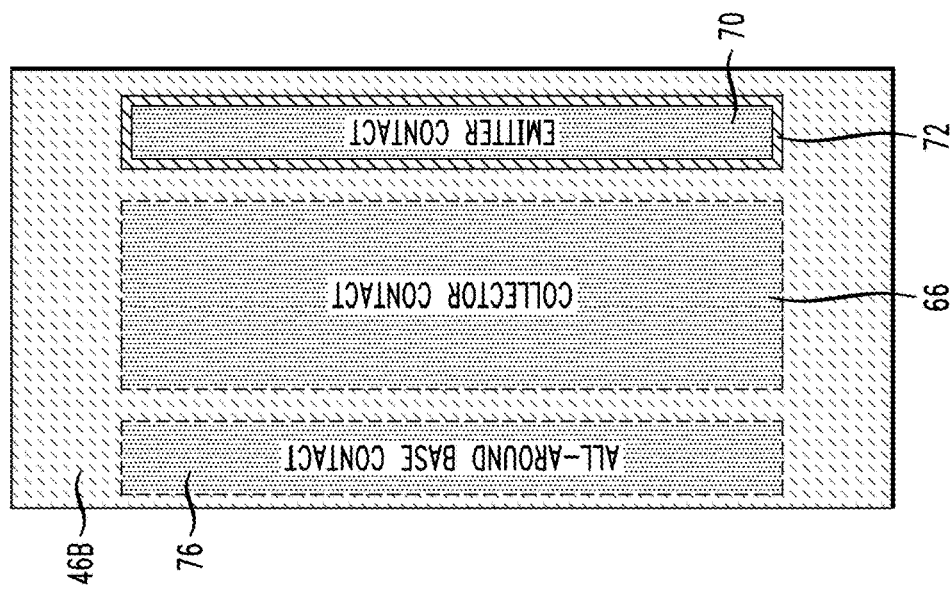
FIGS. 1A and 1B are schematic, cross-sectional and top plan views, respectively, depicting an exemplary single column bipolar junction transistor (BJT) having an all-around base.
Figure 1A:
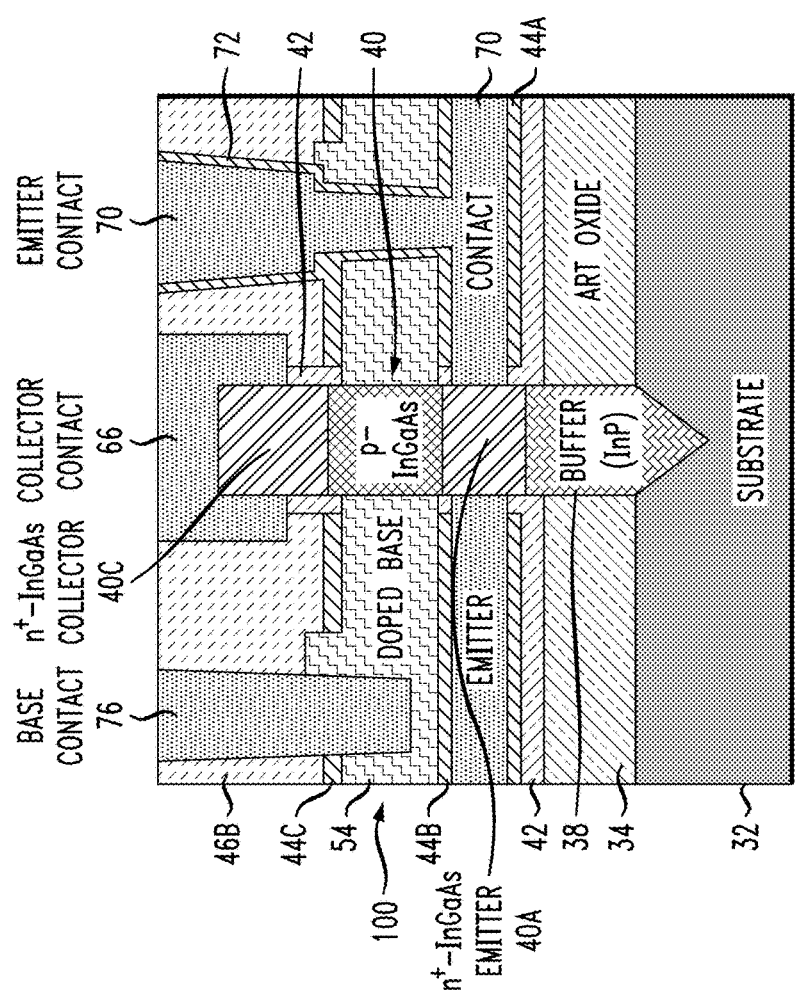

FIGS. 1A and 1B are cross-sectional and top plan views, respectively, that schematically depict an exemplary single column compound semiconductor bipolar junction transistor (BJT) 100 on a silicon-based substrate. FIGS. 2-14 schematically illustrate an exemplary sequence of fabrication steps that may be employed in obtaining the BJT 100. Exemplary contact formation steps are schematically illustrated in FIGS. 15-25. Contacts for the BJT 100 can be formed in orders different from those depicted therein. By way of example only and without limitation, FIGS. 2-25 are views depicting exemplary processing steps/stages in the fabrication of an exemplary vertical BJT 100. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

Figure 2:
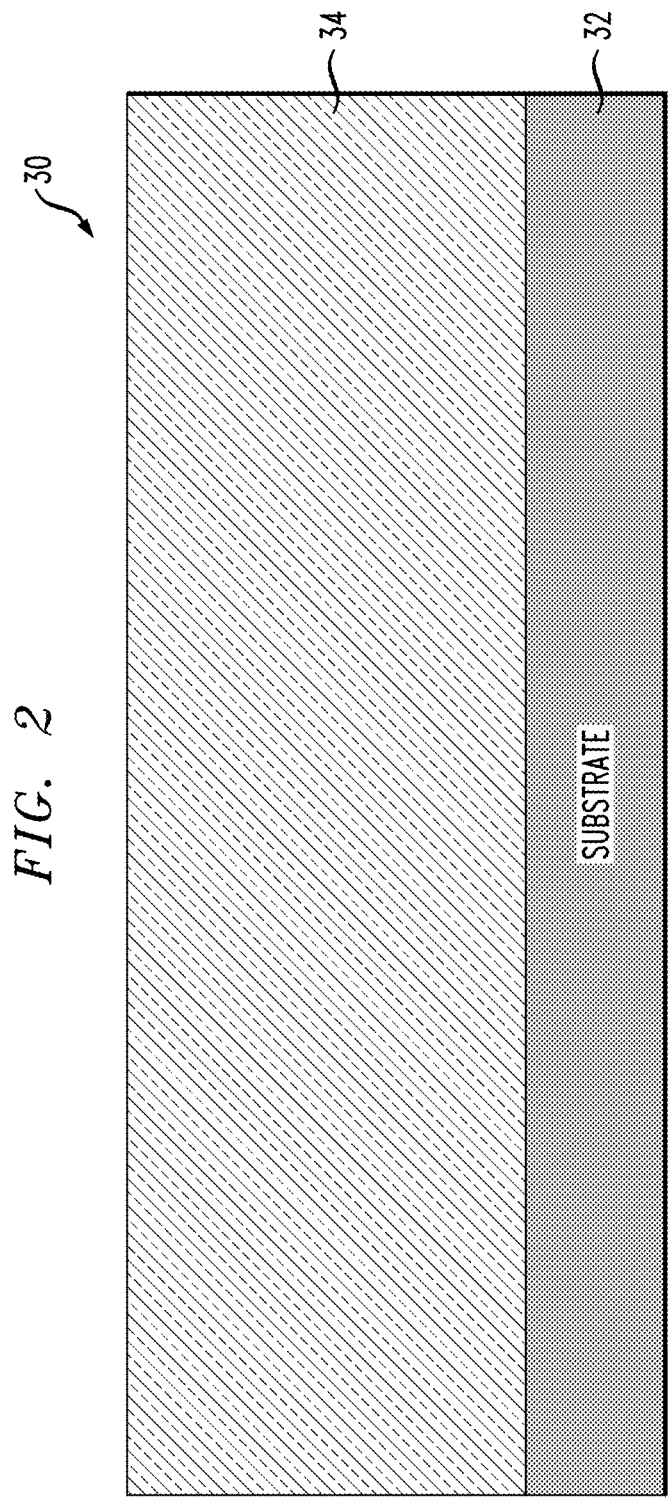
FIG. 2 is a cross-sectional view showing a silicon substrate having a dielectric layer thereon.

With reference now to FIG. 2, a structure 30 including bulk silicon wafer 32 is employed as the substrate in some embodiments. The substrate consists essentially of monocrystalline silicon in one or more embodiments. Other semiconductor substrates may alternatively be employed such as germanium substrates, silicon-on-insulator substrates, germanium-on-insulator (GeOI) substrates and SGOI (SiGe on insulator) substrates. The substrate has a surface portion that allows the subsequent epitaxial growth of silicon-containing materials thereon without the difficulties and problems associated with growing such material on substrates where a significant lattice mismatch would be present. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including doped or undoped (100) silicon as a substrate material, it will be appreciated that the principles expressed are applicable to other semiconductor substrates and substrates with crystallographic orientations other than (100) on which III-V semiconductor materials can be epitaxially grown, including off-axis silicon substrates. The lattice mismatch between silicon and many III-V semiconductor materials needs to be addressed when combining such materials in an electronic device. Aspect ratio trapping (ART) is an effective technique to trap threading dislocations, thereby reducing the dislocation density of lattice mismatched materials grown on silicon. Referring again to FIG. 2, an oxide layer 34 is deposited on the substrate. Non-limiting examples of materials for the oxide layer 34 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide layer has a thickness in a range from about one hundred to one thousand (100-1,000) nanometers in some embodiments, though such a thickness range is not considered critical.

Figure 3:
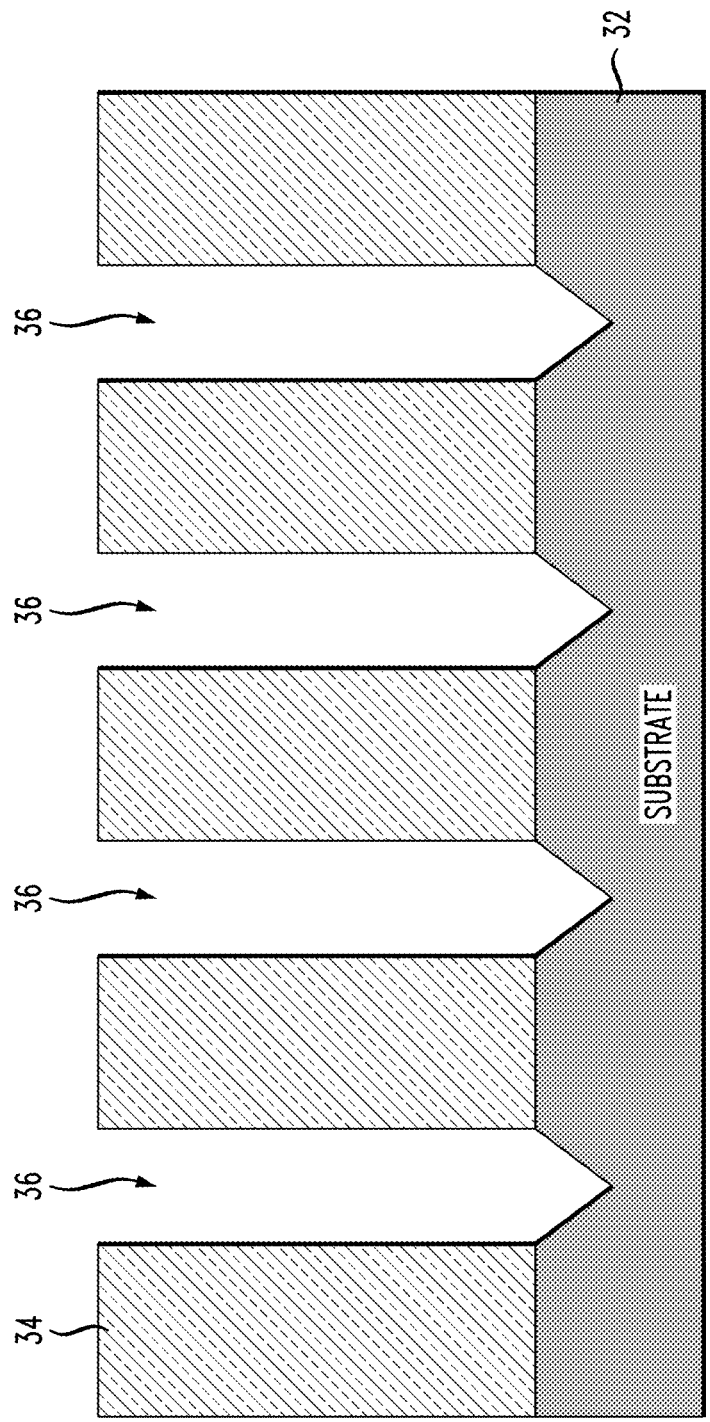
FIG. 3 is a schematic, cross-sectional view showing an aspect ratio trapping structure including trenches formed in the dielectric layer.

As shown in FIG. 3, trenches 36 are formed in the structure for facilitating aspect ratio trapping. The etch process used to form the trenches 36 may be, for example, a reactive ion etch. As known in the art, oxide can be selectively etched using $CHF_3$/Ar plasma. The trenches 36 extend from the top surface of the oxide layer 34 to and optionally into the semiconductor (e.g. silicon) substrate. Trench width is in a range of five to fifty nanometers (5-50 nm). A patterned mask (not shown) having openings corresponding to the trench locations is formed on the top surface of the oxide layer 34 prior to etching the oxide material. The mask protects the remainder of the structure. V-shaped recesses are optionally formed within the substrate at the bottom ends of the trenches. A second etch (isotropic wet etch) is used to etch the optional V-shaped recesses in the silicon substrate.

Figure 4:
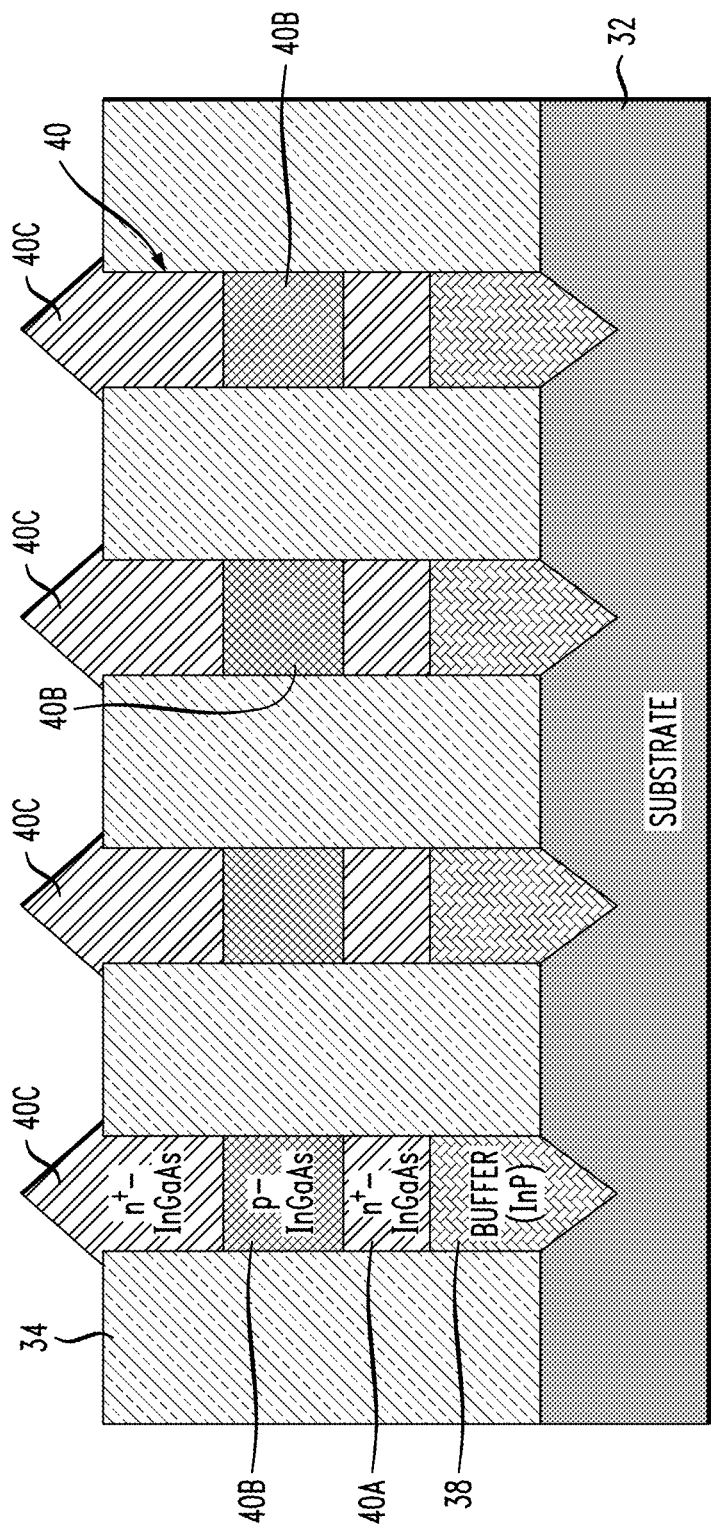
FIG. 4 is a schematic, cross-sectional view thereof following epitaxial growth of III-V compound semiconductor columns within the trenches.

Referring to FIG. 4, a III-V compound semiconductor structure is epitaxially grown as a vertical column 40 within the trenches. III-V compound semiconductors are obtained by combining group III elements (for example, Al, Ga, In) with group V elements (for example, N, P, As, Sb). GaAs, InGaAs, InP, GaP, and GaN are examples of III-V compound semiconductors. The surface of the substrate 32 is cleaned if required to remove materials such as oxides that may be present prior to growth of the III-V layer thereon. In one exemplary embodiment, InP is epitaxially grown on the substrate as a buffer layer 38. The buffer layer fills the lower end portions of the trenches 36 and directly contacts the substrate. The lattice constants of $In_{0.53}Ga_{0.47}As$ and InP are the same, allowing a high quality InGaAs layer to be grown on InP. Various processes are familiar to those of skill in the art for growing III-V semiconductor materials on silicon substrates. Such processes include metalorganic chemical vapor deposition (MOCVD) and molecular beam epitaxy (MBE). Many different III-V compounds could be grown on the substrate 32 and accordingly multiple precursors could be used. Depending on which III-V material(s) is to be grown and which precursor is used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on silicon and on other III-V semiconductor materials are well known in the art and new methods continue to be developed. The deposited InP layer that directly contacts the exposed top (optionally recessed) surface of the substrate 32 may include misfit defects caused by lattice mismatch near the interface with the top surface of the substrate 32 and threading dislocations that propagate towards the surface thereof. The widths of the trenches 36 and the thicknesses of the InP layers are configured for aspect ratio trapping to help prevent threading dislocations from extending to the surfaces of the InP layers on which subsequent III-V layers are formed. In one exemplary embodiment, an InGaAs layer including three sublayers 40A, 40B and 40C is grown on the InP buffer layer 38. The first (bottom) and last (top) sublayers 40A and 40C are heavily doped layers having a first conductivity type (e.g. n+) while the middle layer 40B has a second conductivity type opposite to the first conductivity type. The top sublayer 40C (the collector in the subsequently formed exemplary BJT) preferably has the same or nearly the same lattice constant as the adjoining middle III-V sublayer 40B (the BJT's intrinsic III-V base region). The dopants may be incorporated in situ using appropriate precursors, as known in the art. By "in-situ" it is meant that the dopant that dictates the conductivity type of a doped layer is introduced during the process step, e.g., epitaxial deposition, that forms the doped layer.

In one exemplary embodiment, the first and last heavily doped InGaAs sublayers have doping concentrations of 1e19-2e21 $cm^{-3}$ or greater and the middle sublayer 40B is p-type with a doping concentration of 1e17-1e19 $cm^{-3}$. The thickness of each of the sublayers 40A, 40B, 40C may be between five and forty nanometers (5 nm-40 nm] and the top (last deposited) sublayer 40C may extend outside the trenches 36 and above the top surface of the oxide layer 34. The widths of the III-V sublayers 40A, 40B and 40C are the same in one or more embodiments. The thicknesses of the III-V sublayers 40A, 40B, 40C may or may not be the same.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. Silicon can be used as an n-type dopant in III-V semiconductor materials. P-type dopants that can be used in III-V semiconductor materials include zinc, carbon, and silicon. Silicon can be used to obtain both p-type and n-type conductivity in a III-V semiconductor material. Tellurium, tin, and germanium are among the dopants that may be incorporated in III-V semiconductor materials to obtain n-type conductivity.

The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Figure 5:
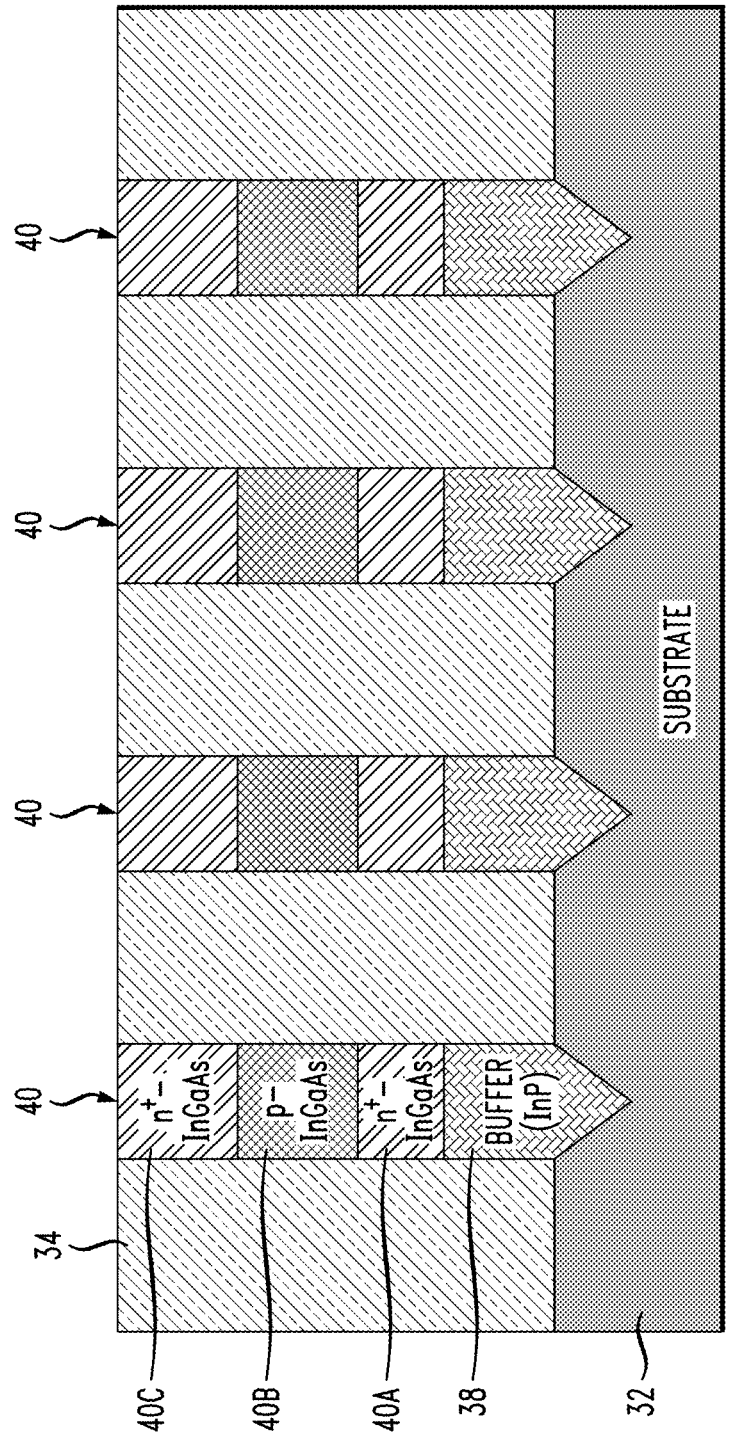
FIG. 5 is a schematic, cross-sectional view of the structure of FIG. 4 following chemical mechanical planarization.
Figure 6:
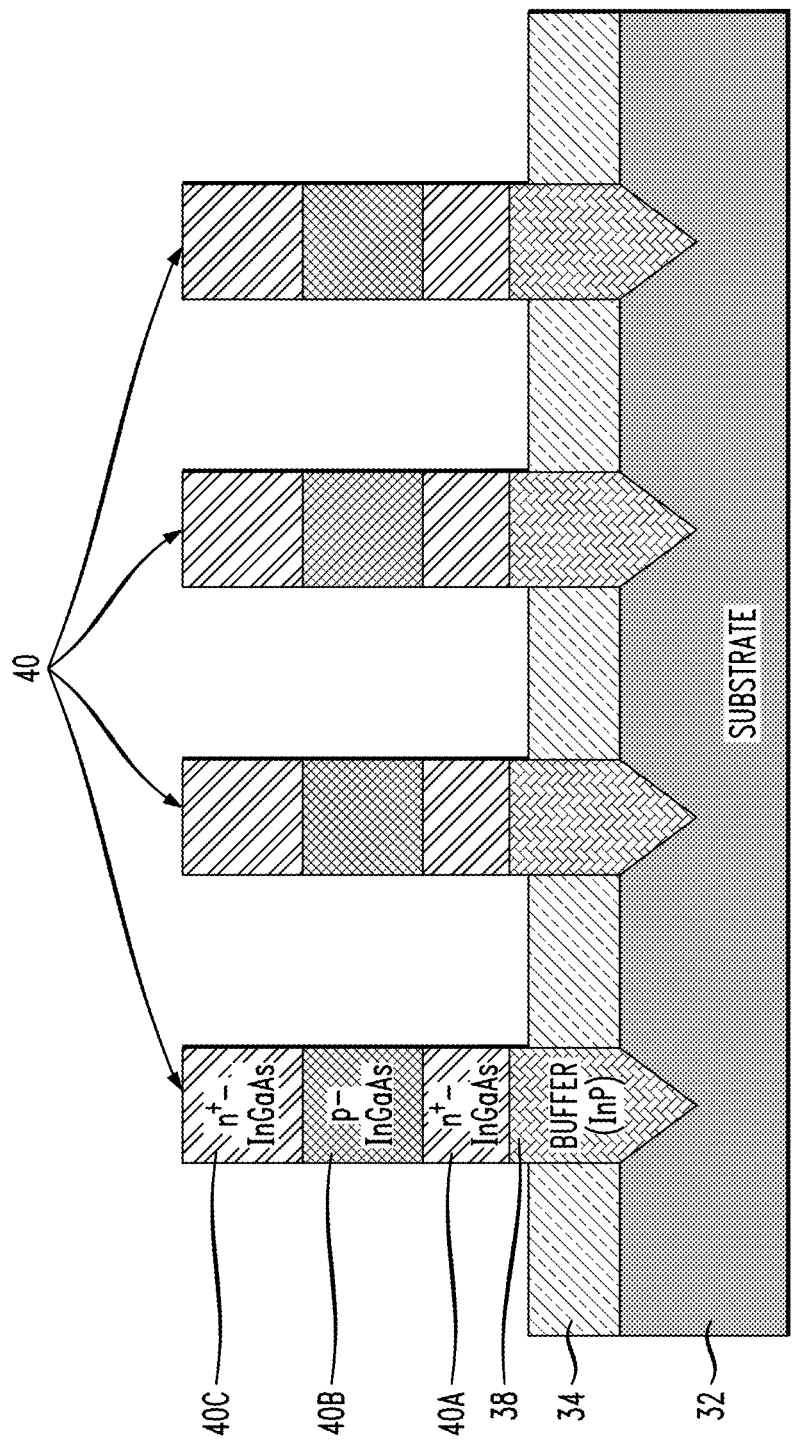
FIG. 6 is a schematic, cross-sectional view thereof following recessing of the dielectric layer to expose the columns.

Following epitaxial growth of the III-V layers within the trenches 36, the structure obtained is planarized using chemical mechanical planarization (CMP) or other suitable process. The top III-V sublayer 40C of the resulting structure is planarized and is also coplanar with the top surface of the oxide layer 34, as shown in FIG. 5. The oxide layer 34 is then recessed below the top of the III-V buffer layer 38, thereby exposing columns 40 including the III-V sublayers 40A, 40B and 40C. Oxide removal is conducted using, for example, a chemical oxide removal (COR) process, a SiCoNi™ vapor phase etch process or a reactive ion etch. The COR process selectively etches exposed surfaces of the oxide layer. The COR process generally includes exposing surfaces of the oxide layer 34 to process gases and heat treating the chemically treated oxide surface layer. A COR process, as known in the art, may include exposing the structure of FIG. 5 to a gaseous or vaporous mixture of HF and ammonia. A SiCoNi™ etch is a plasma-assisted dry etch process that involves simultaneous exposure of a substrate to hydrogen, $NF_3$ and $NH_3$ plasma by-products. The remaining portion of the oxide layer 34 between columns has a substantially uniform thickness, as shown in FIG. 6. The etch is timed to allow a portion of the original oxide layer 34 to remain on the substrate 32 and between the III-V buffer layers 38.

Figure 7:
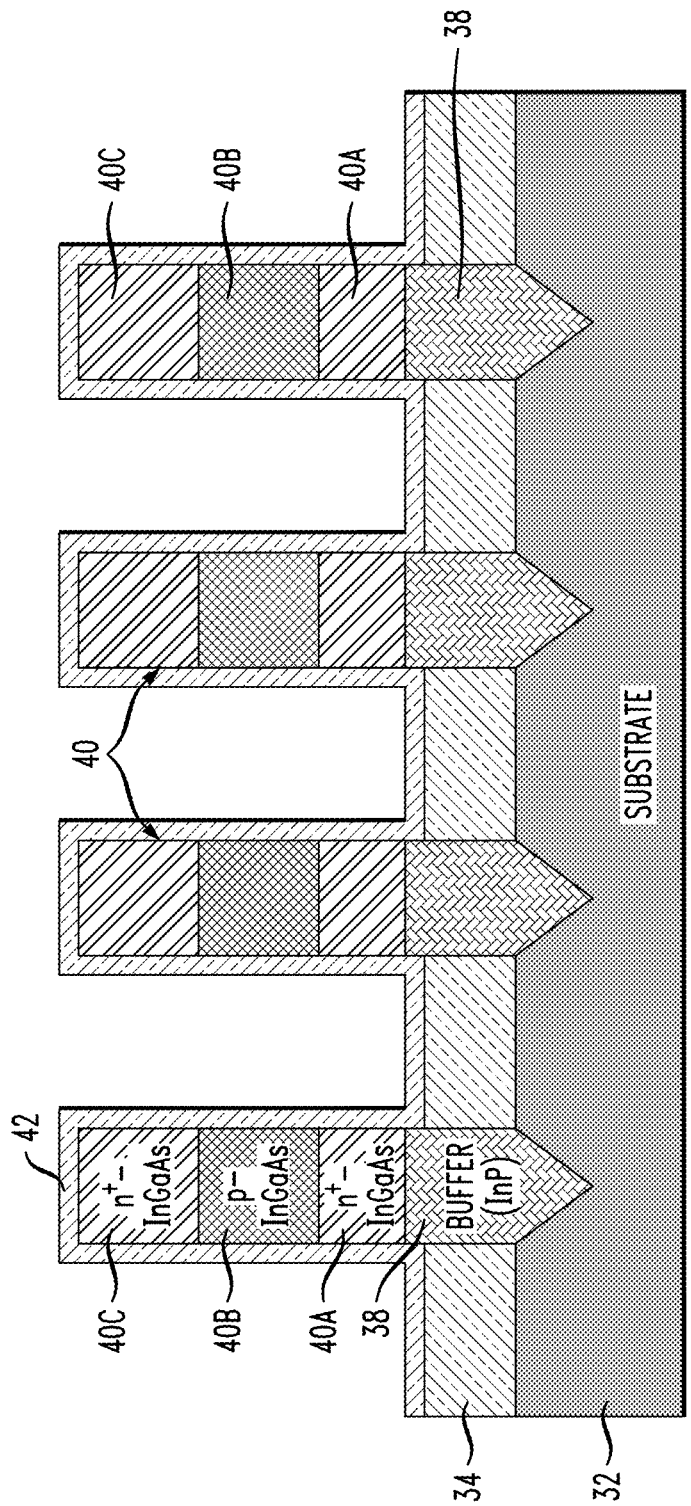
FIG. 7 is a schematic, cross-sectional view of the structure of FIG. 6 following deposition of a dielectric liner.
Figure 8:
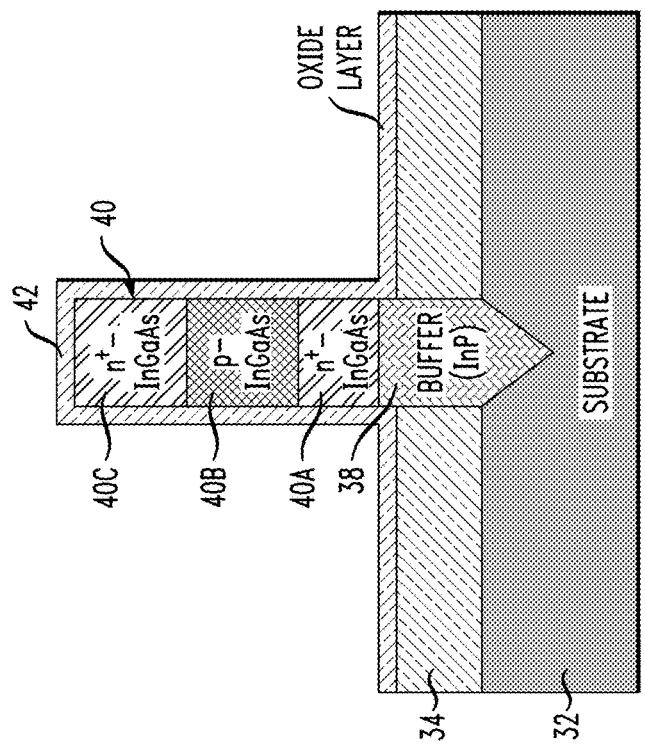
FIG. 8 is a schematic, cross-sectional view showing a portion of the structure shown in FIG. 7 including one of the III-V compound semiconductor columns.
Figure 12:
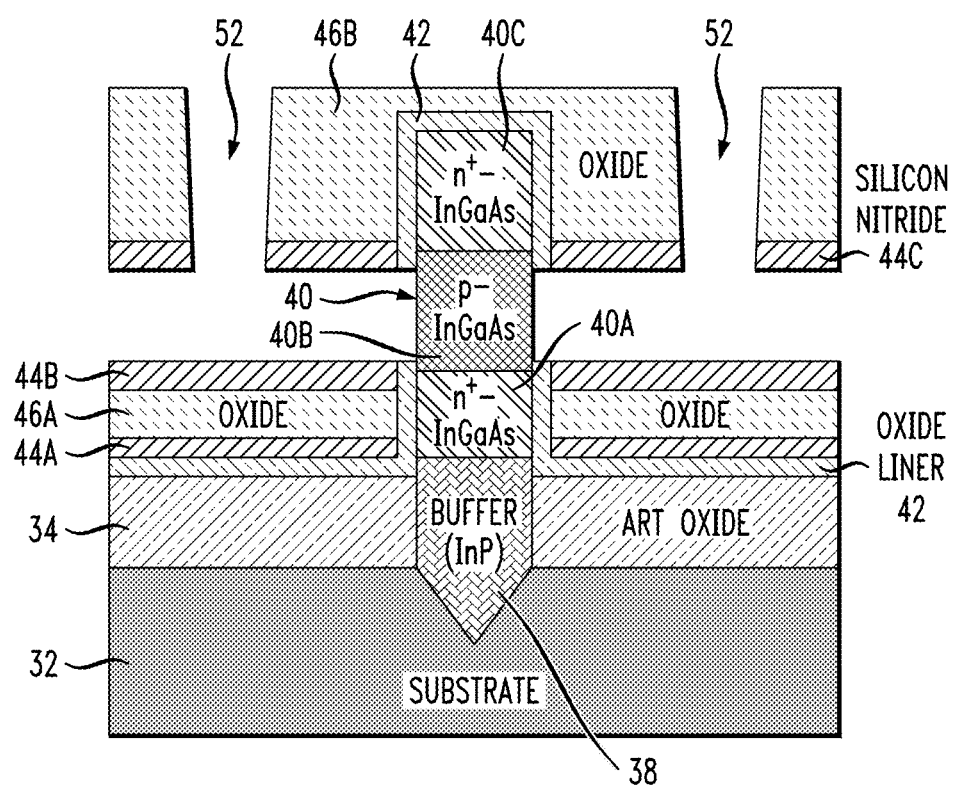
FIG. 12 is a schematic, cross-sectional view thereof following removal of the dielectric liner from an intrinsic base region of the III-V compound semiconductor column.

A oxide liner 42 is deposited on the top surface of the structure shown in FIG. 6 to obtain a structure as shown in FIGS. 7 and 8. (FIG. 8 and subsequent figures show only one of the plurality of columns of III-V semiconductor materials present in the structure.) The oxide liner can be deposited using atomic layer deposition and adjoins the columns 40 and the remaining portion of the oxide layer 34 between the columns 40.

Figure 9:
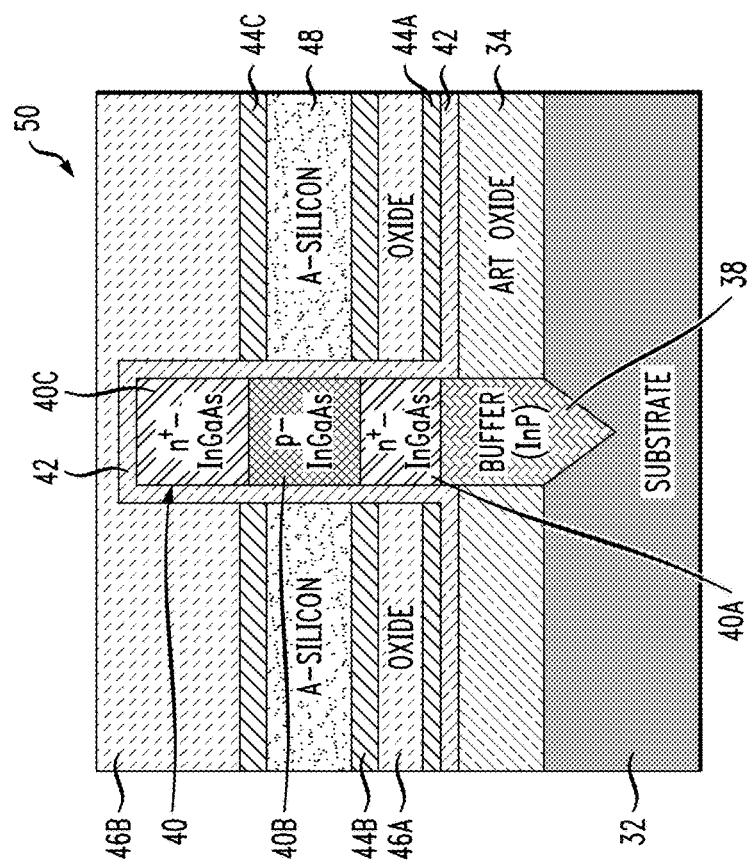
FIG. 9 is a schematic, cross-sectional view of the structure shown in FIG. 8 following deposition of spacers and sacrificial layers thereon.

FIG. 9 shows a structure 50 following the directional deposit of spacers and other layers on the structures shown in FIGS. 7 and 8. First, second and third spacers 44A, 44B and 44C are deposited, respectively, on the oxide liner 42, a first oxide (e.g. silicon oxide) layer 46A, and a sacrificial layer 48. The spacers can be deposited using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

A second oxide layer 46B is deposited on the third (top) spacer 44C and a portion of the oxide liner 42 on the top portions of the III-V columns 40. The thickness of the second oxide layer 46B is sufficient to completely encapsulate the top regions of the columns following planarization thereof. It also has a much greater thickness than the first oxide layer 46A to facilitate later contact formation, as discussed further below. The spacers 44A, 44B and 44B may be silicon nitride spacers. The sacrificial layer 48 may be an amorphous silicon (a-Si) or a polycrystalline silicon (polysilicon) layer. The sacrificial material may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. Hydrogenated amorphous silicon is typically deposited by plasma-enhanced chemical vapor deposition (PECVD) although other techniques such as hot-wire chemical vapor deposition (HW-CVD) may be used. The first spacer 44A is parallel to and generally co-linear with the junction of the III-V buffer layer and the bottom III-V sublayer 40A. The top surface of the first spacer 44A is further above the top surface of the substrate 32 than the top surface of the III-V buffer layer 38. The second spacer is parallel to and generally co-linear with the junction of the III-V middle sublayer 40B and the bottom III-V sublayer 40A. The third (top) spacer is parallel to and generally co-linear with the junction of the III-V middle sublayer and the top III-V sublayer 40C. The entirety of the first oxide layer 46A is between the first and second spacers and is in opposing relation to the bottom III-V sublayer 40A. The entirety of the sacrificial layer 48 is between the second and third spacers and is in opposing relation to the middle III-V sublayer 40B. The entirety of the second oxide layer 46B is further above the top surface of the substrate 32 than is the junction of the III-V middle sublayer 40B and the top III-V sublayer 40C. The oxide layers 46A, 46B are sacrificial layers that protect the heavily doped sublayers of the III-V column during later processing and which are removed partially or entirely during emitter and collector contact formation. The structure 50 as schematically illustrated is obtained following CMP.

Referring to FIGS. 10A and 10B, trenches 52 are formed entirely around each III-V column 40 down to and partially within the sacrificial layer 48. Such trenches extend through the second (top) oxide layer 46B, the top spacer 44C and into the sacrificial layer 48. A patterned mask (not shown) and sequential reactive ion etch processes can be employed to etch through the top oxide layer, the top spacer and sacrificial layer materials. The etch may be timed or otherwise controlled to stop within the sacrificial layer 48.

The sacrificial layer 48 is removed to obtain the structure shown in FIGS. 11A and 11B. A wet etch using hot ammonia can be introduced through the trenches 52 to selectively remove the sacrificial layer while leaving the spacers 44B, 44C and the thin oxide layer 42 substantially intact. The portion of the thin oxide layer 42 adjoining the middle III-V sublayer 40B of the III-V column 40 is then removed to obtain the structure shown in FIG. 12. Such removal can involve using a SiCoNi™ etch, a short HF etch, or any other suitable pre-clean process.

Figure 13B:
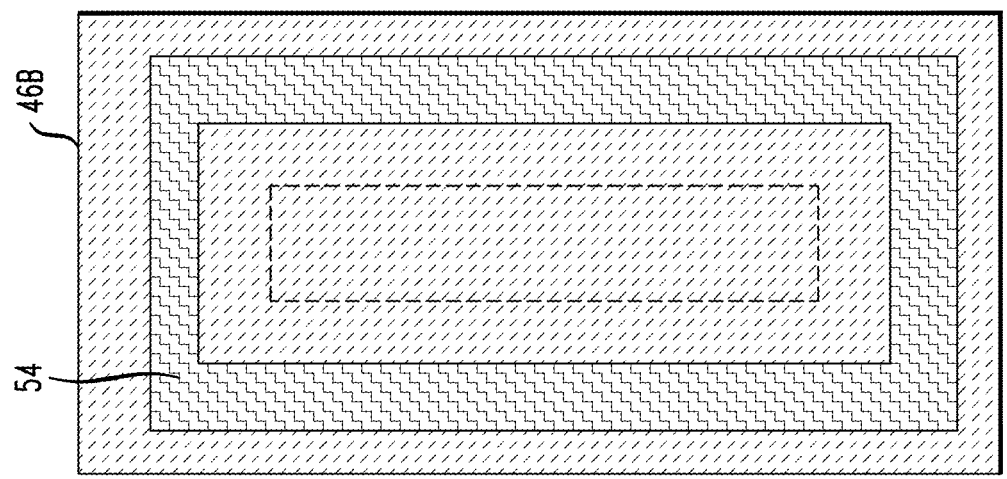
FIGS. 13A and 13B are schematic, cross-sectional and top plan views, respectively, following epitaxial growth of extrinsic base material on the base region of the III-V compound semiconductor column.
Figure 13A:
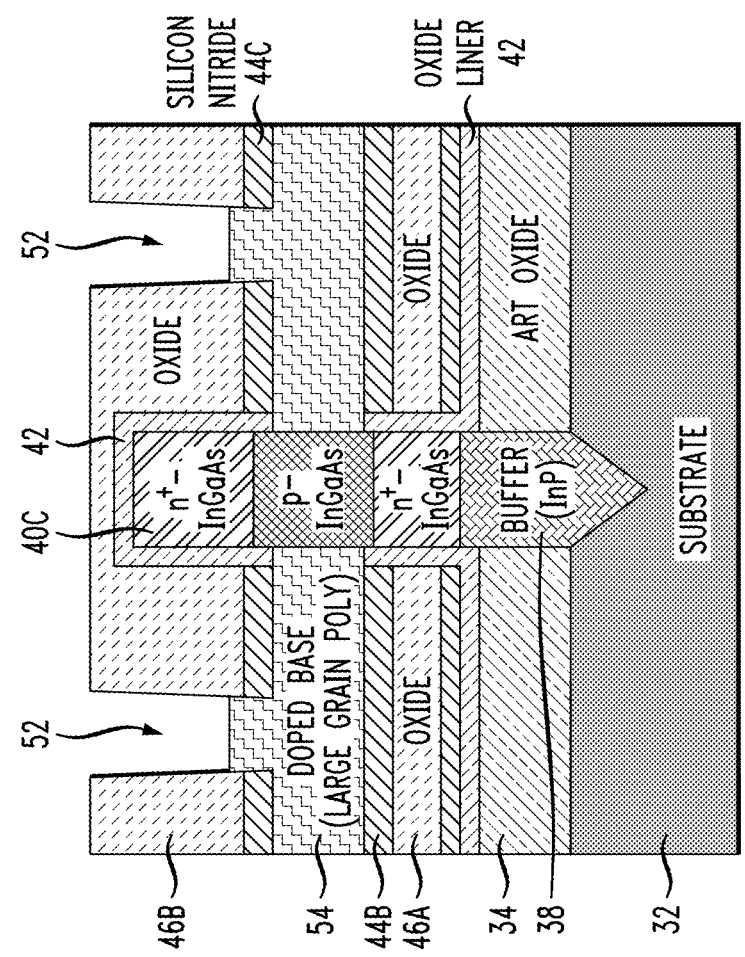
Figure 14:
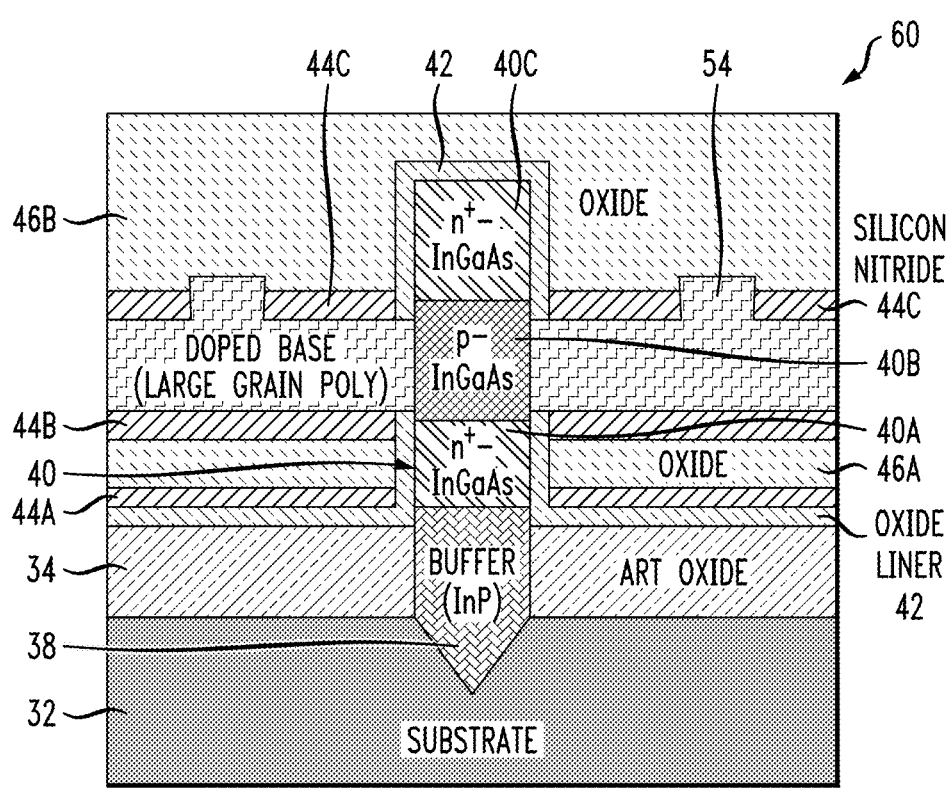
FIG. 14 is a schematic, cross-sectional view of the structure shown in FIG. 13A following filling of the all-around trench.

A doped, extrinsic base 54 is epitaxially grown on and all around the exposed III-V middle sublayers 40B (the intrinsic base regions of subsequently formed BJTs) of the III-V columns 40, thereby obtaining a structure as shown in FIGS. 13A and 13B. The epitaxy is highly defective due to lattice mismatch and/or the imperfect exposed surfaces of the middle sublayers 40B. The doping concentration of the extrinsic base 54 is in the range of $4 \times 10^{19}$ atoms/cm$^3$ to $6 \times 10^{21}$ atoms/cm$^3$ in the exemplary embodiments. Exemplary doped extrinsic base materials in some embodiments include silicon, silicon germanium, and germanium. The defective epitaxy, rather than being single crystalline, includes large single crystals with grain boundaries. The extrinsic base 54 is bounded by the middle and top horizontal spacers 44B, 44C and portions of the thin oxide layer 42 that remain on the III-V columns 40. Each extrinsic base extends completely around the intrinsic base region (sublayer 40B) with which it is operatively associated. Large grain polysilicon having p-type conductivity comprises the extrinsic base 54 in an exemplary embodiment where the intrinsic, epitaxial base region is also p-type. Defects within the extrinsic base 54 will not propagate into the base epitaxy (sublayer 40B), which is used as a seed layer, upon growth of the extrinsic base 54 thereon. Following formation of the extrinsic base 54, the trenches 52 are filled with oxide material and planarized to obtain the structure 60 shown in FIG. 14. The same oxide material used to form the oxide layers 46A, 46B may be used to fill the trenches 52. The top and bottom sublayers 40C, 40A of each column 40 form the collector and emitter of a bipolar transistor. Doped poly-SiGe, doped poly-Ge and doped III-V compound semiconductor materials are among the materials that may alternatively be employed for the extrinsic base 54 of the exemplary structure.

Figure 15B:
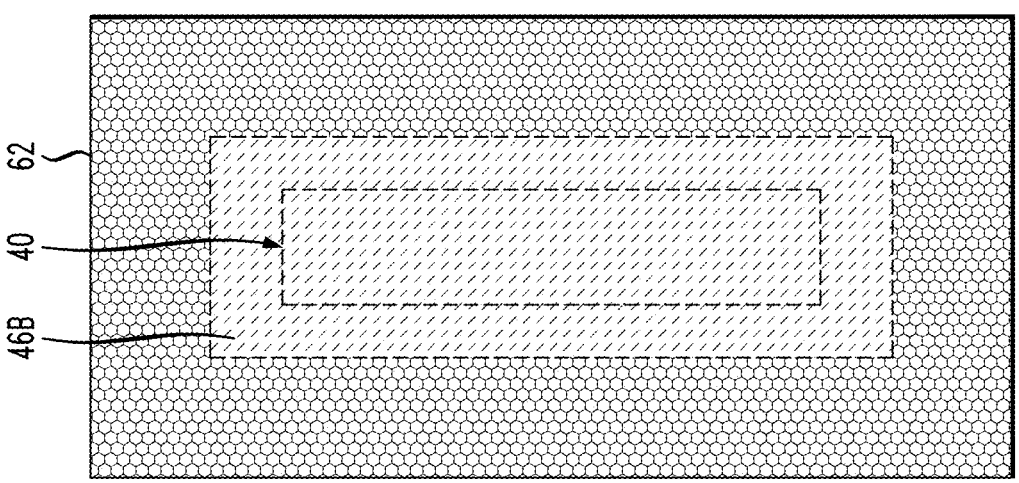
Figure 15A:
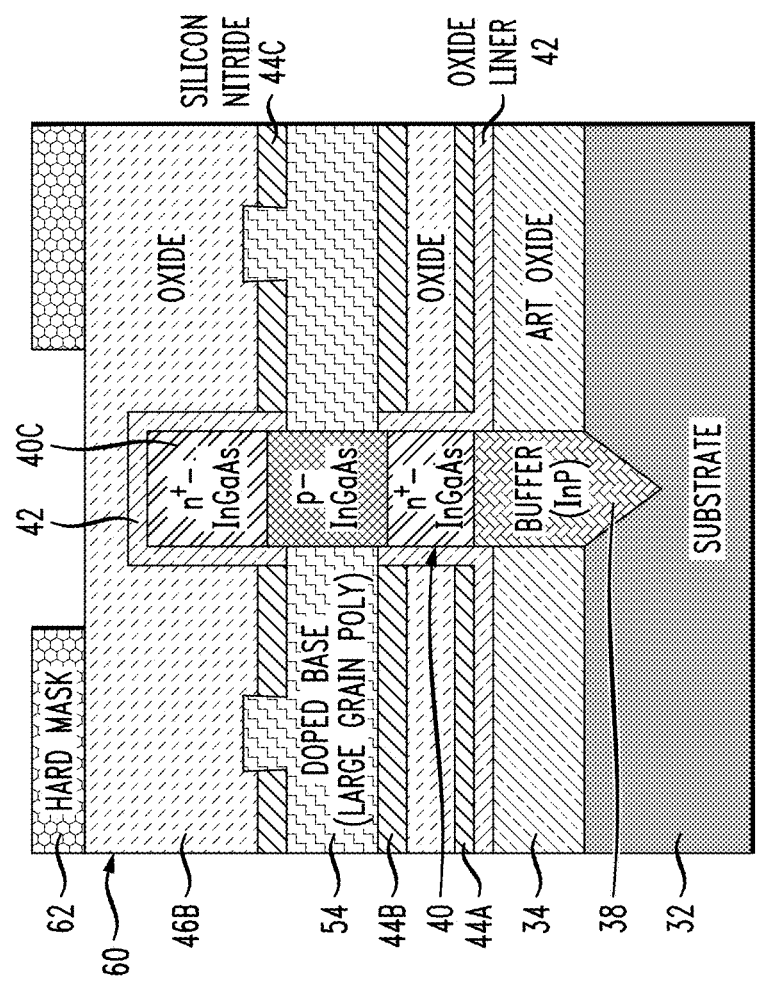
Figure 16B:
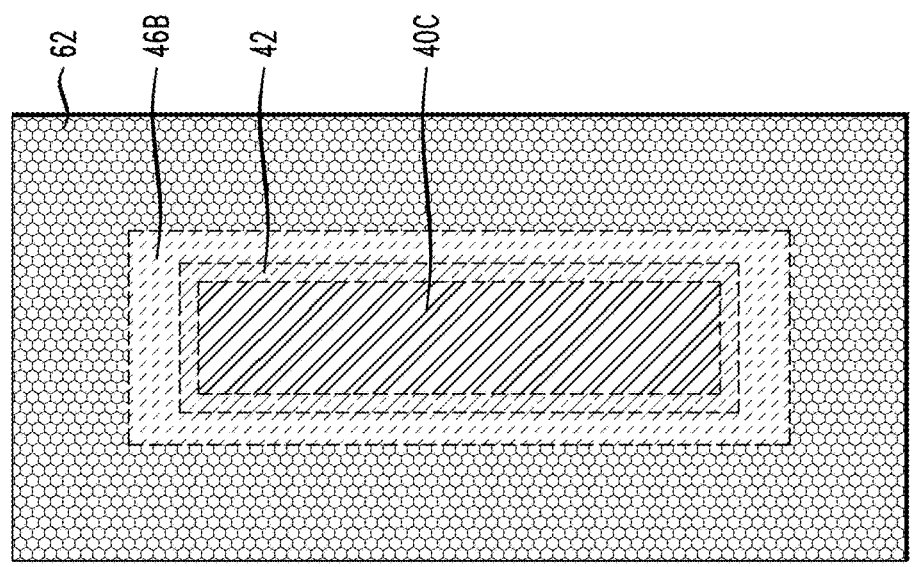
Figure 16A:
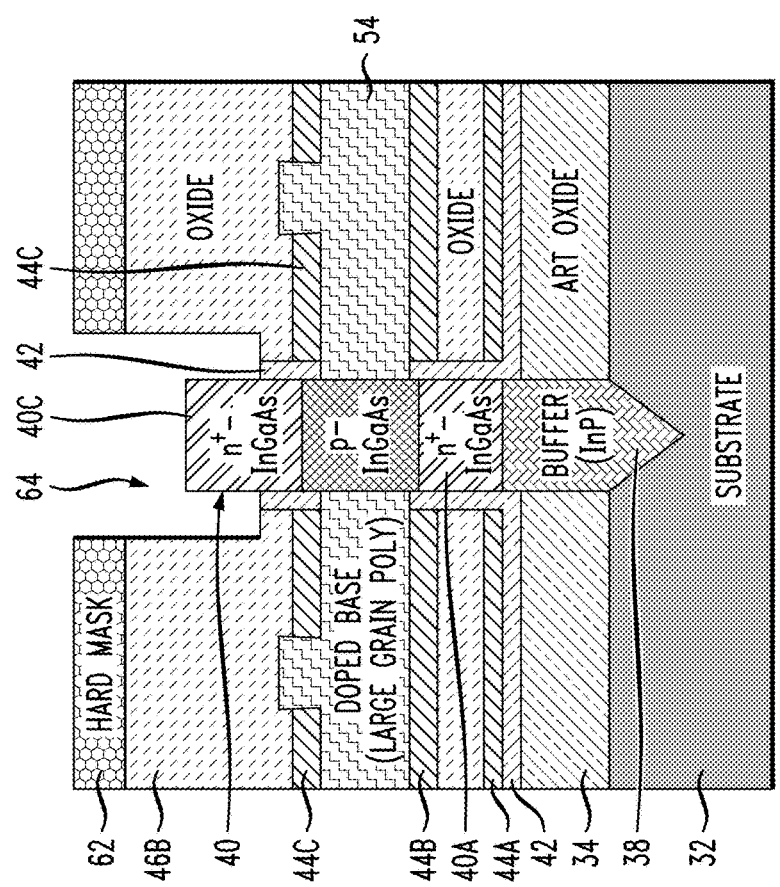
Figure 17B:
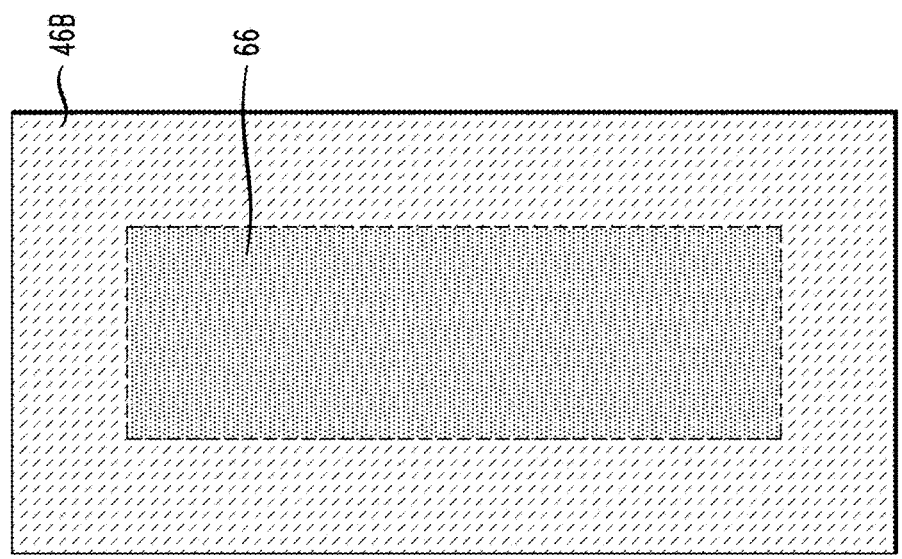
Figure 17A:
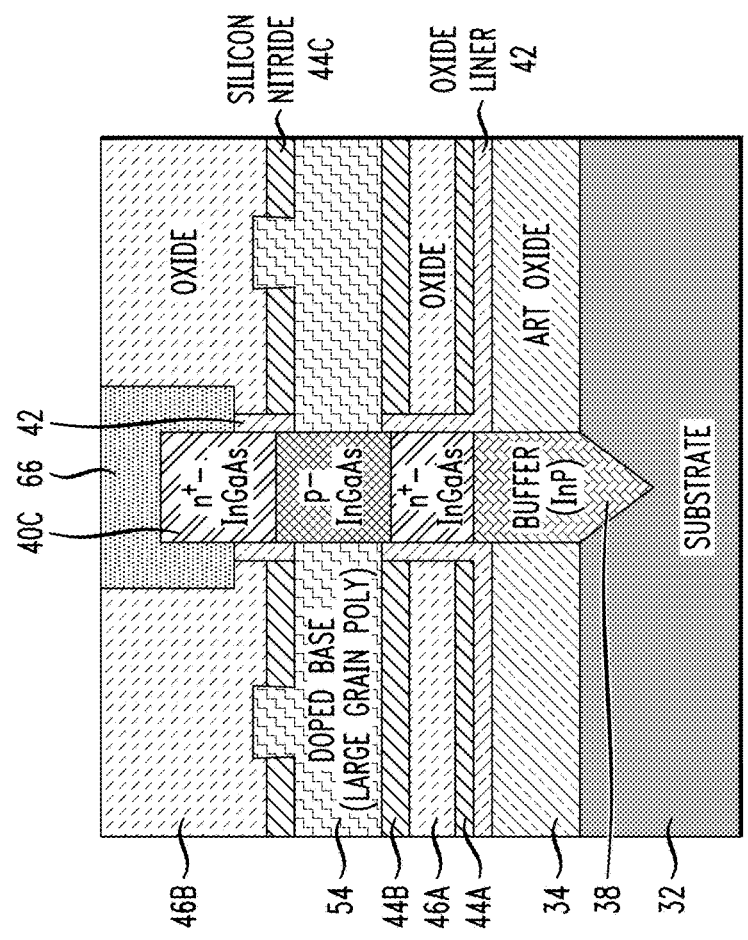

An exemplary sequence of steps used in contact formation to obtain the structure 100 shown in FIGS. 1A and 1B is schematically illustrated in FIGS. 15A-B through FIG. 25. Referring to FIGS. 15A and 15B, a patterned hard mask 62 (e.g. silicon nitride) is formed on the structure 60 that leaves the portions of the oxide layer 46B above the III-V columns 40 unprotected. The oxide layer 46B is partially recessed as shown in FIGS. 16A and 16B to expose the top portion of the top III-V sublayer 40C. A reactive ion etch (ME) may be employed to remove the oxide material. The etch is stopped above the top surface of the top spacer 44C, leaving a recess 64 into which the top III-V sublayer 40C extends. A collector contact 66 is formed in the recess, as shown in FIGS. 17A and 17B. Contact material may, for example, include aluminum (Al), platinum (Pt), gold (Au), tungsten (W), titanium (Ti), palladium (Pd) or any combination thereof. The contact material may be deposited by, for example, CVD, PECVD, PVD, plating, thermal or e-beam evaporation, or sputtering. A planarization process, for example, CMP, is performed to remove any conductive material from the top surface of the oxide layer 46B.

Figure 18:
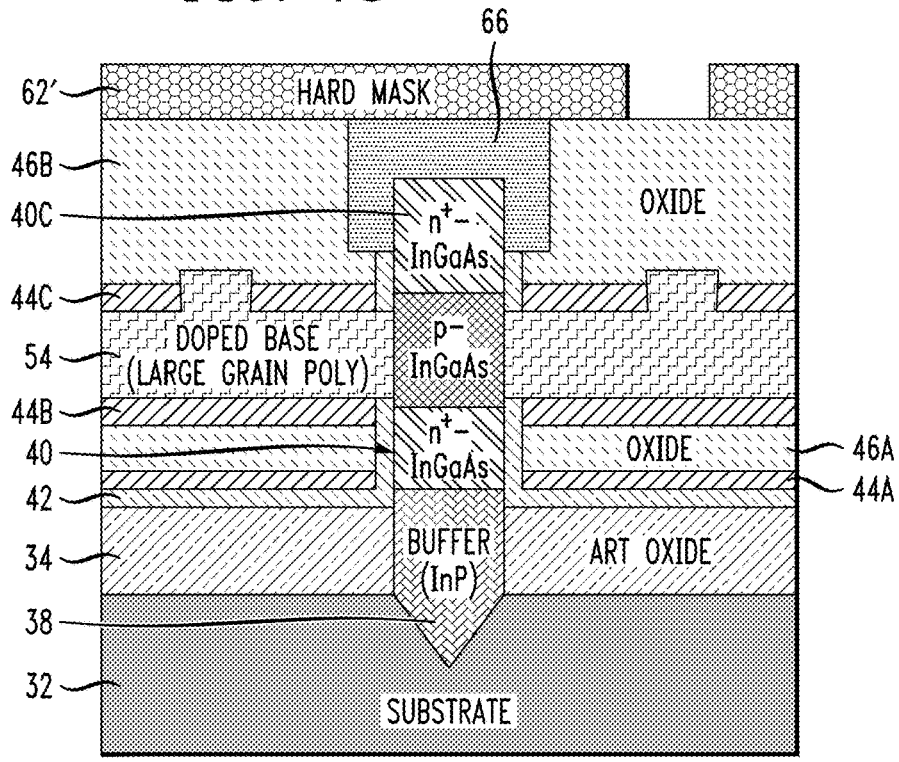
Figure 19:
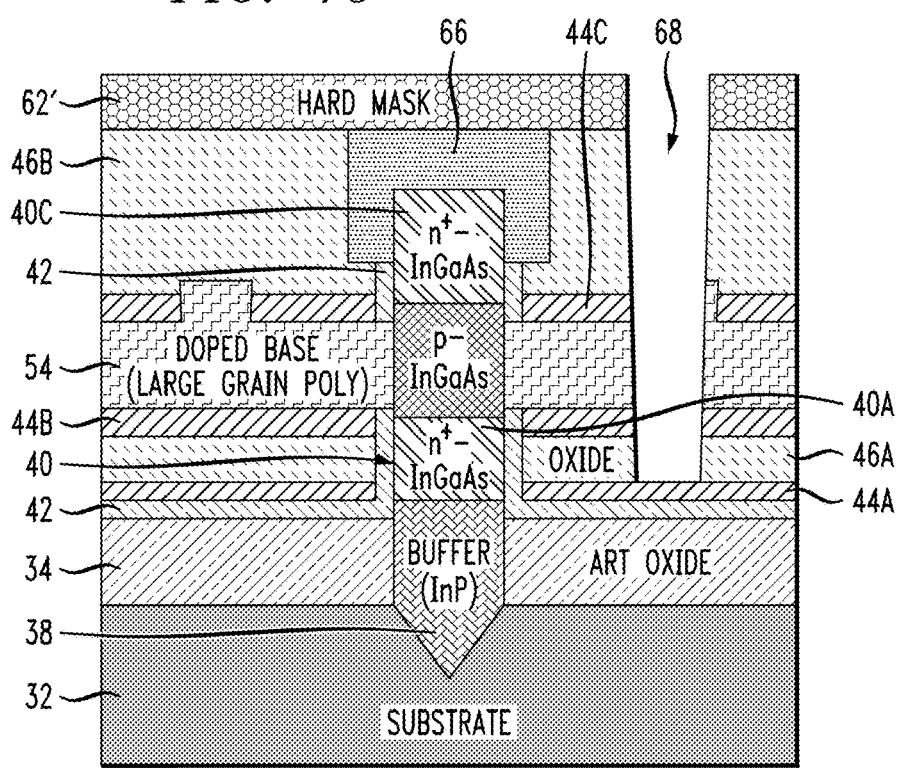
Figure 20:
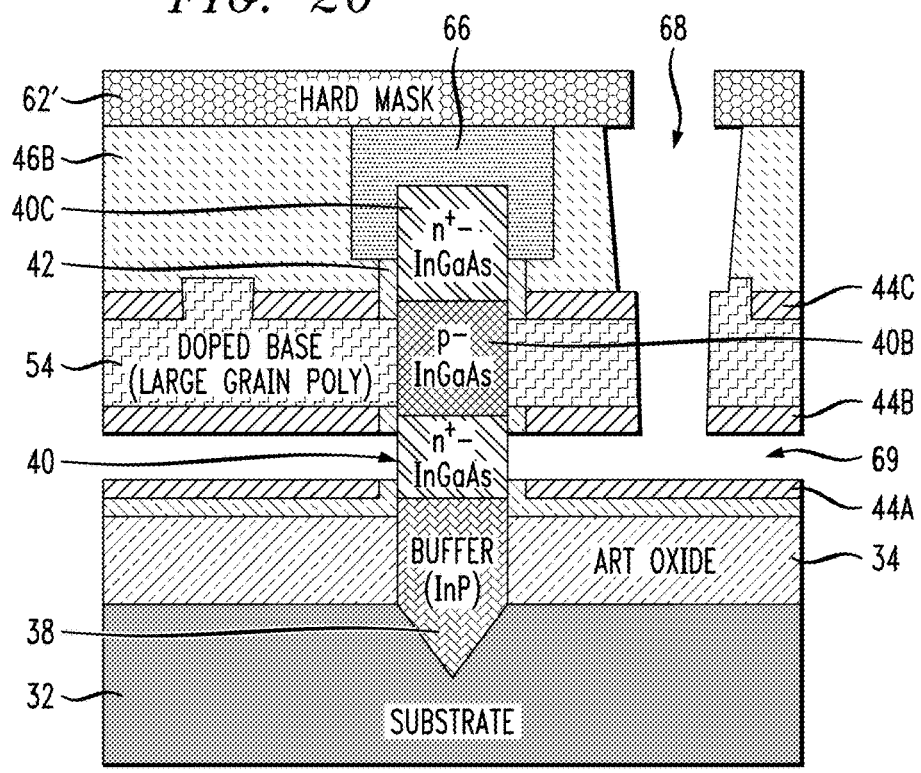

A second hard mask 62' is formed on the structure obtained following collector contact formation. The second hard mask includes openings above portions of the top oxide layer 46B and protects other portions of the structure, including the collector contacts 66. FIG. 18 shows one such mask opening adjacent to one of the III-V columns 40. RIE is employed to etch through the top oxide layer 46B, the top and middle spacers 44C, 44B, the doped extrinsic base 54, and the bottom oxide layer 46A. The bottom spacer 44A functions as an etch stop. A trench 68 extending from the top surface of the structure to the bottom spacer 44A is accordingly formed, as shown in FIG. 19. Following formation of the trench, the oxide material comprising the top and bottom oxide layers 46B, 46A and the portion of the oxide liner 42 adjoining the bottom III-V layer 40A of the III-V column 40 is etched selectively to the spacers 44A, 44B and 44C and the III-V column 40. The bottom oxide layer 46A is entirely removed. The top oxide layer 46B, being much thicker than the bottom oxide layer 46A, is only partially removed when the etch process is discontinued. The trench 68 accordingly includes an expanded upper portion following the selective etch due to partial removal of the adjoining oxide material in the top oxide layer 46B. A timed, low concentration HF etch may be employed for the selective etch. The low HF concentration allows good control of the oxide removal process. Any oxide remaining on the bottom III-V sublayer 40A can be removed by a SiCoNi™ etch prior to metal deposition FIG. 20 is a cross sectional view that schematically illustrates a portion of the structure following the oxide etch.

Figure 21:
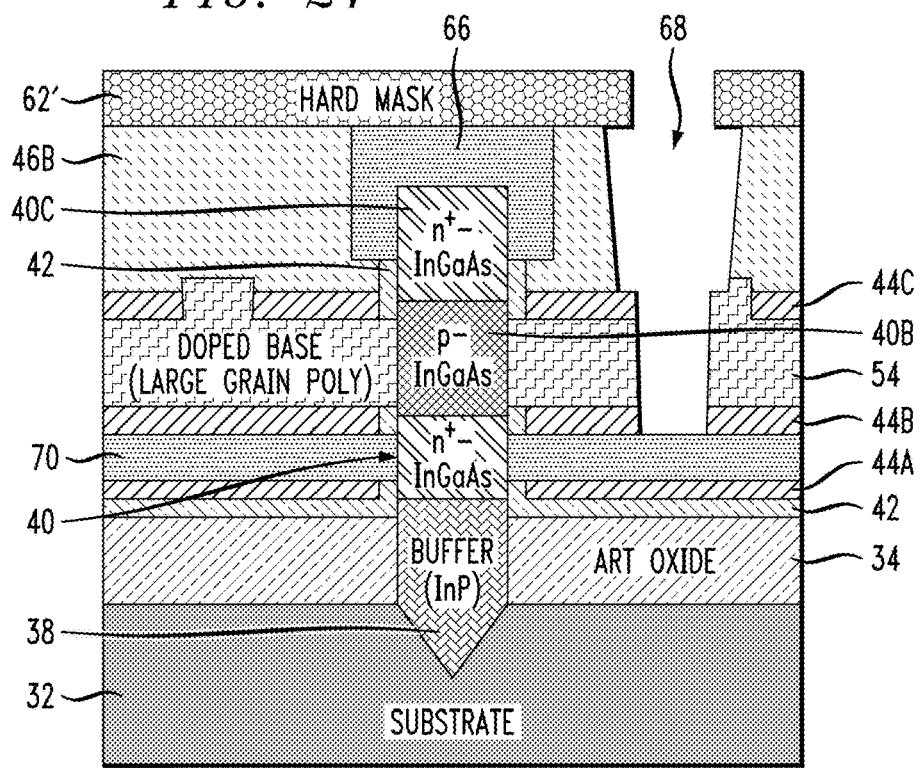
Figure 22:
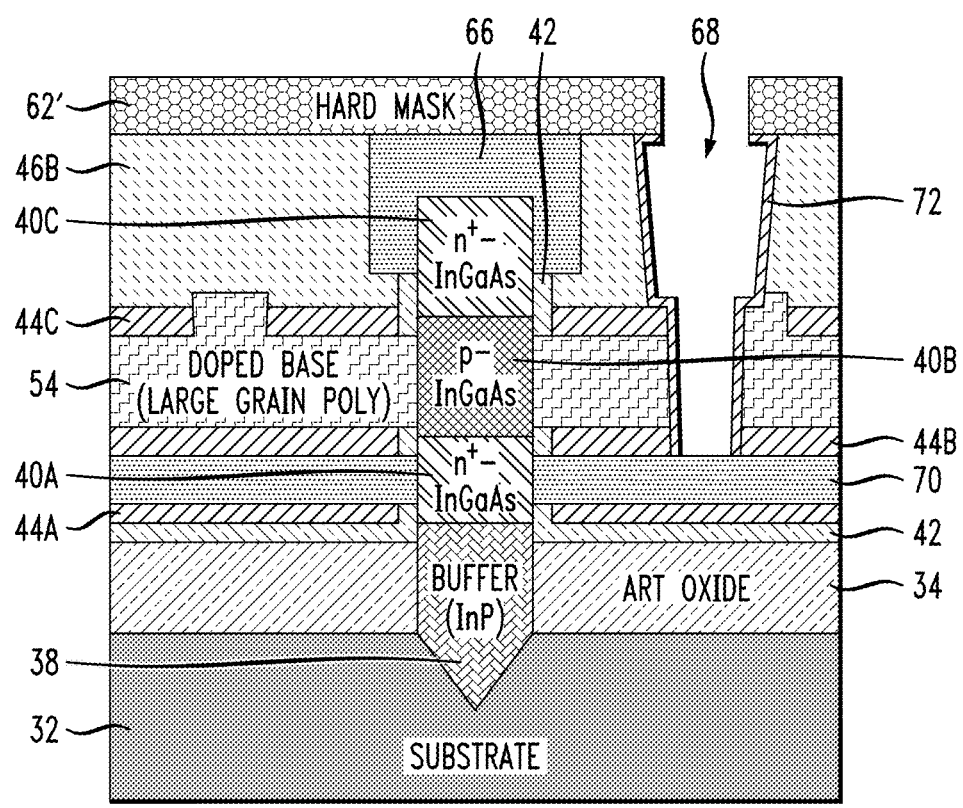
Figure 23B:
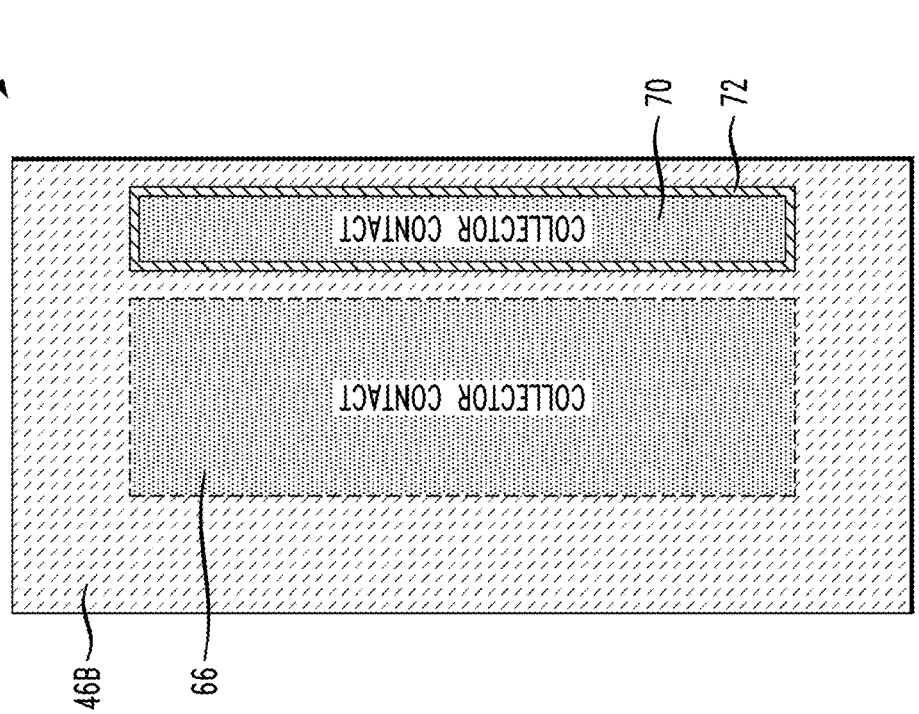
Figure 23A:
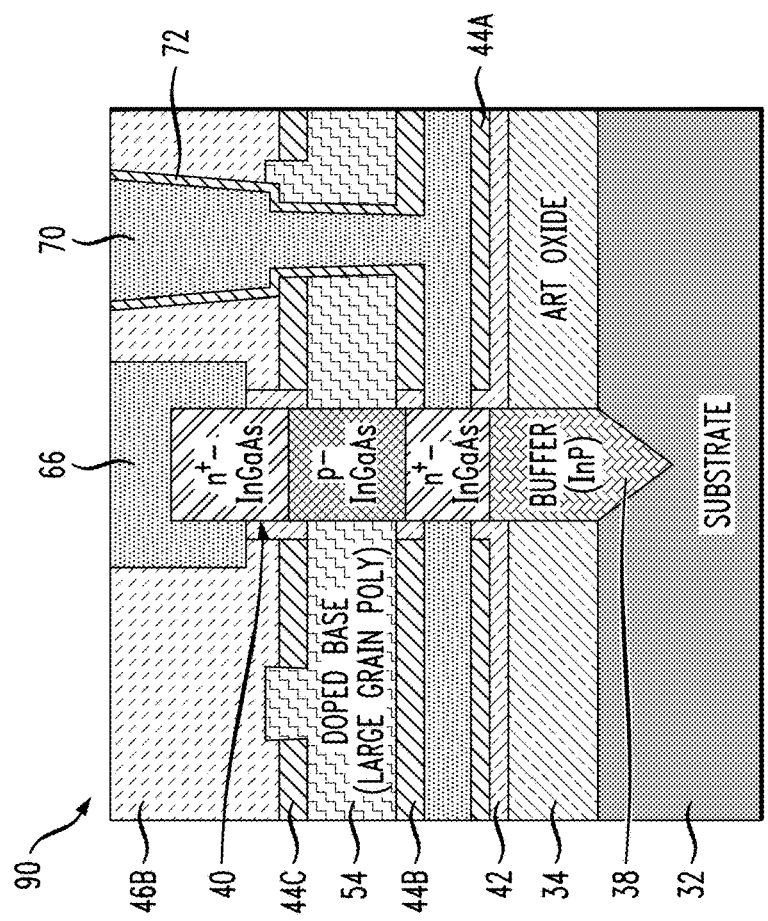

Referring to FIG. 21, a bottom contact 70 is formed in the region 69 between the bottom and middle spacers 44A, 44B formerly filled by the bottom oxide layer 46A. Contact metal is deposited on the structure, filling the trench 68 and the region 69. The contact metal directly contacts the bottom sublayer 40A of the III-V column, which can function as the BJT emitter. The contact metal is then etched back beneath the middle spacer 44B. A liner 72 as shown in FIG. 22 is formed within the trench and lines surfaces of the extrinsic base 54 and top oxide layer 46B. The liner helps prevent emitter to base electrical shorting. Silicon nitride may be used to form the liner 72. The emitter contact 70 is then completed by filling the trench 68 with contact metal. Excess metal can be removed using CMP. FIGS. 23A and 23B are cross sectional and top plan views that schematically illustrate a structure 90 including completed collector and emitter contacts.

A base contact mask 62" is deposited and patterned on the structure 90. The mask 62" protects the collector and emitter contacts formed in previous steps. Openings in the mask allow access to the extrinsic base 54. Trenches 74 are formed through the top oxide layer 46B and top spacer 44C and extend partially within the extrinsic base 54. A sequence of RIE processes may be employed to form the trenches. FIG. 25 shows one of the trenches 74 on one side of a III-V column 40 opposite to the side including an emitter contact 70. Base contacts 76 are formed in the trenches 74 by depositing contact metal. Excess metal is removed by CMP to obtain completed bipolar junction transistors 100 such as that shown in FIGS. 1A and 1B. The processes described herein may be used to obtain either homojunction bipolar transistor devices or heterojunction bipolar transistor devices (which typically use differing semiconductor materials for the base and emitter regions). In one exemplary homojunction BJT obtained using techniques as disclosed herein, the emitter, intrinsic base, and the collector consist essentially of the same compound semiconductor material (e.g. InGaAs). The bandgap for $In_{0.53}Ga_{0.47}As$ matched to InP is about 0.75 eV, which is ideal for logic devices. Smaller bandgap III-V materials would be desired for lower voltage logic applications. Larger bandgap III-V compound semiconductor materials (e.g. GaAs) can be employed for high voltage or power transistor applications. In an exemplary heterojunction bipolar transistor, the emitter (sublayer 40A) could consist essentially of InGaAlAs. The inclusion of a small percentage of aluminium (Al) widens the bandgap. The percentage of indium (In) in the emitter of the heterojunction device can be a few percent higher than in the other sublayers to compensate for lattice shrinkage due to the smaller size of the aluminium atom. In the exemplary embodiment shown in FIGS. 1A and 1B, the emitter and collector are formed of n-type conductivity material while the base is formed of p-type conductivity material; therefore the transistor 100 is considered an NPN device. The emitter and collector of the transistor 100 may alternatively be formed of a p-type conductivity material and the base formed of an n-type conductivity material, thereby resulting in a vertical PNP BJT device. The emitter and collector are symmetric in some embodiments.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary single column bipolar junction transistor device as disclosed herein includes a silicon substrate 32 such as a bulk silicon wafer. A trench 36 extends through a dielectric layer 34 on the top surface of the substrate. A vertical column 40 of III-V compound semiconductor material extends from the semiconductor substrate, the vertical column including a heavily doped III-V compound semiconductor collector having a first conductivity type, a heavily doped III-V compound semiconductor emitter having the first conductivity type, and a doped III-V compound semiconductor sublayer 40B having a second conductivity type opposite to the first conductivity type, the doped III-V compound semiconductor sublayer being between and directly contacting the collector and the emitter. A III-V compound semiconductor buffer layer 38 extends through the trench in the dielectric layer 34 and directly contacts the vertical column 40 and the substrate 32, possibly extending into the substrate 32. A doped extrinsic base 54 completely surrounds and directly contacts the doped III-V compound semiconductor sublayer 40B. A collector contact is electrically connected to the collector, an emitter contact is electrically connected to the emitter, and a base contact is electrically connected to the extrinsic base. FIGS. 1A and 1B illustrate an exemplary device, it being appreciated that many such single column bipolar junction transistor devices can be formed on the substrate. As discussed above, the device can be either a homojunction or a heterojunction device.

Given the discussion thus far, it will also be appreciated that an exemplary method for fabricating a structure including a single column bipolar junction transistor device is provided. The method includes obtaining a structure including a semiconductor substrate, a dielectric layer on the substrate, and a vertically extending trench extending through the dielectric layer, the vertically extending trench being configured for aspect ratio trapping. FIG. 3 shows such a structure including a plurality of vertically extending trenches 36. A vertical column of III-V compound semiconductor material is formed within the vertically extending trench by epitaxially growing a III-V compound semiconductor buffer layer 38 on the substrate, epitaxially growing a heavily doped III-V compound semiconductor bottom sublayer 40A having a first conductivity type on the buffer layer, epitaxially growing a doped III-V compound semiconductor middle sublayer 40B having a second conductivity type opposite to the first conductivity type on the bottom sublayer, and epitaxially growing a heavily doped III-V compound semiconductor top sublayer 40C having the first conductivity type on the middle sublayer. FIG. 4 shows the formation of four such columns. The dielectric layer 34 is recessed to expose at least the top, middle and bottom sublayers of the vertical column, as shown in FIG. 6. A plurality of sacrificial layers over the recessed dielectric layer, the plurality of sacrificial layers including a bottom sacrificial layer around the bottom sublayer, a middle sacrificial layer around the middle sublayer and a top sacrificial layer around the top sublayer. The middle sacrificial layer 48 is removed to form a space between the bottom and top sacrificial layers followed by epitaxially growing a doped extrinsic base 54 on the middle sublayer and within the space between the bottom and top sacrificial layers. The extrinsic base extends entirely around the middle sublayer as shown in FIGS. 13A and 13B. In some embodiments, a bottom spacer 44A, a middle spacer 44B and a top spacer 44C are deposited such that the space in which the doped extrinsic base 54 is formed is bounded by the middle and top spacers. The method may further include removing the bottom sacrificial layer 46A to form a lateral space between the bottom and middle spacers 44A, 44B as shown in FIG. 20, removing a previously formed dielectric liner 42 from the bottom sublayer 40A of the vertical column, and forming a lateral emitter contact portion in the lateral space, wherein the lateral emitter contact portion directly contacts the bottom sublayer.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having compound semiconductor BJTs therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "on" or "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A single column bipolar junction transistor device, comprising:
    a semiconductor substrate;
    a dielectric layer on the semiconductor substrate;
    a trench extending through the dielectric layer;
    a vertical column extending from the semiconductor substrate, the vertical column including:
        a doped III-V compound semiconductor collector having a first conductivity type, a doped III-V compound semiconductor emitter having the first conductivity type, and a doped III-V compound semiconductor sublayer having a second conductivity type opposite to the first conductivity type, the doped III-V compound semiconductor sublayer being between and directly contacting the collector and the emitter;

a III-V compound semiconductor buffer layer extending through the trench and directly contacting the vertical column and the semiconductor substrate;

a doped extrinsic base completely surrounding and directly contacting the doped III-V compound semiconductor sublayer, the extrinsic base consisting essentially of doped polysilicon having a defective epitaxial structure;

a collector contact electrically connected to the collector;

an emitter contact electrically connected to the emitter, and a base contact electrically connected to the extrinsic base.

2. The single column bipolar junction transistor device of claim 1, wherein the substrate comprises silicon.

3. The single column bipolar junction transistor device of claim 2, wherein the dielectric layer includes an oxide layer on the substrate.

4. The single column bipolar junction transistor device of claim 2, further including a top dielectric spacer on a top surface of the doped extrinsic base and a middle dielectric spacer on a bottom surface of the doped extrinsic base.

5. The single column bipolar junction transistor device of claim 2, wherein the collector, the emitter, and the doped III-V compound semiconductor sublayer have the same width.

6. The single column bipolar junction transistor device of claim 5, wherein the collector, the emitter, and the doped III-V compound semiconductor sublayer consist essentially of the same III-V compound semiconductor material.

7. The single column bipolar junction transistor device of claim 5, wherein the doped extrinsic base comprises a defective epitaxial semiconductor material.

8. The single column bipolar junction transistor device of claim 1, wherein the buffer layer extends within the substrate.

9. The single column bipolar junction transistor device of claim 8, wherein at least a bottom portion of the buffer layer within the substrate is formed having V-shaped sidewalls.

10. The single column bipolar junction transistor device of claim 1, further comprising a middle dielectric spacer on a bottom surface of the doped extrinsic base, and a bottom dielectric spacer, the emitter contact including a first portion extending laterally from the emitter between the bottom dielectric spacer and the middle dielectric spacer, and a second portion extending vertically from the first portion.

11. A single column bipolar junction transistor device, comprising:

a semiconductor substrate;

a dielectric layer on the semiconductor substrate;

a trench extending through the dielectric layer;

a vertical column extending from the semiconductor substrate, the vertical column including:

a doped III-V compound semiconductor collector having a first conductivity type, a doped III-V compound semiconductor emitter having the first conductivity type, and a doped III-V compound semiconductor sublayer having a second conductivity type opposite to the first conductivity type, the doped III-V compound semiconductor sublayer being between and directly contacting the collector and the emitter;

a III-V compound semiconductor buffer layer extending through the trench and directly contacting the vertical column and the semiconductor substrate;

a doped extrinsic base completely surrounding and directly contacting the doped III-V compound semiconductor sublayer;

a collector contact electrically connected to the collector;

an emitter contact electrically connected to the emitter;

a base contact electrically connected to the extrinsic base;

a top dielectric spacer on a top surface of the doped extrinsic base;

a middle dielectric spacer on a bottom surface of the doped extrinsic base; and a bottom dielectric spacer, the emitter contact including a first portion extending laterally from the emitter between the bottom dielectric spacer and the middle dielectric spacer and a second portion extending vertically from the first portion.

* * * * *